United States Patent [19]

Nishizawa

[11] Patent Number: 4,994,999
[45] Date of Patent: Feb. 19, 1991

[54] HIGH-SPEED AND HIGH-DENSITY SEMICONDUCTOR MEMORY

[75] Inventor: Jun-ichi Nishizawa, Sendai, Japan

[73] Assignee: Zaidan Hojin Handotai Kenkyu Shinkokai, Sendai, Japan

[21] Appl. No.: 87,974

[22] Filed: Aug. 17, 1987

Related U.S. Application Data

[60] Continuation of Ser. No. 514,595, Jul. 18, 1983, abandoned, which is a division of Ser. No. 174,724, Aug. 4, 1980, Pat. No. 4,434,433, which is a continuation of Ser. No. 878,441, Feb. 16, 1978.

[30] Foreign Application Priority Data

| Feb. 21, 1977 | [JP] | Japan | 52-18465 |
| Feb. 26, 1977 | [JP] | Japan | 52-20653 |
| Mar. 30, 1977 | [JP] | Japan | 52-35956 |
| Mar. 31, 1977 | [JP] | Japan | 52-36304 |
| Apr. 2, 1977 | [JP] | Japan | 52-37905 |
| Jul. 11, 1977 | [JP] | Japan | 52-83226 |

[51] Int. Cl.$^5$ .................... G11C 11/40; A01L 27/04
[52] U.S. Cl. .................... 365/149; 357/22; 357/23.5; 357/23.6
[58] Field of Search ............ 357/23.6, 22, 41, 23.5; 365/149

[56] References Cited

U.S. PATENT DOCUMENTS

| 3,676,715 | 7/1972 | Brojdo | 357/32 |
| 3,876,992 | 4/1975 | Pricer | 365/149 |
| 3,893,155 | 7/1975 | Ogiue | 357/49 |
| 3,982,264 | 9/1976 | Ishitani | 357/22 |
| 3,986,180 | 10/1976 | Cade | 357/22 |
| 4,014,036 | 3/1977 | Ho et al. | 357/24 |
| 4,064,492 | 12/1977 | Schuermeyer et al. | 357/23.5 |
| 4,105,475 | 8/1978 | Jenne | 357/41 |
| 4,115,914 | 9/1978 | Harari | 357/23.5 |
| 4,135,289 | 1/1979 | Brews | 357/24 |
| 4,471,368 | 9/1984 | Mohsen | 357/23.6 |

OTHER PUBLICATIONS

Lewis et al., IBM Tech. Discl. Bulletin, vol. 15, No. 9, Feb. 1973, p. 2822.
Dockerty, IBM Tech. Discl. Bulletin, vol. 19, No. 2, Jul. 1976, p. 510.
Abbas, IBM Tech. Discl. Bulletin, vol. 18, No. 10, Mar. 1976, p. 3300.
Clarke et al., IBM Tech. Discl. Bulletin, vol. 17, No. 9, Feb. 1975, pp. 2578-2579.
Nishizawa et al., Proc. 8th Conf. (1976) on Solid State Devices, Tokyo, 1976, reprinted in Japan. J. Applied Physics, vol. 16, suppl. 16-1, pp. 151-154 (1977).
Electronics, International Edition, Aug. 19, 1976, pp. 4E, 6E.

Primary Examiner—William D. Larkins
Attorney, Agent, or Firm—Cushman, Darby & Cushman

[57] ABSTRACT

A multiplicity of field effect type semiconductor memory elements are formed perpendicular to a surface of a semiconductor wafer. Charge carriers are transported in the semiconductor bulk perpendicular to the surface and a potential barrier is formed in the current path to accomplish storing. Since the bulk mobility of a semiconductor is far larger than the surface mobility, the transit time of the carriers is much improved. Furthermore, since each structure of the memory cells is formed perpendicular to the semiconductor surface, the surface occupation area per memory cell is reduced. Thus, a high-speed and high-density semiconductor memory device is provided.

12 Claims, 24 Drawing Sheets

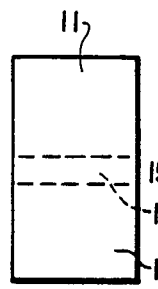 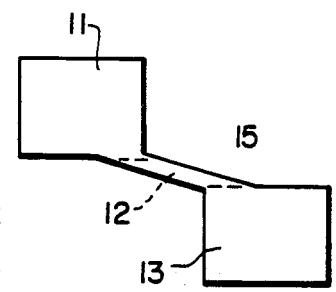 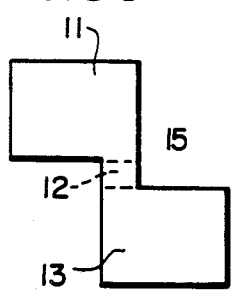 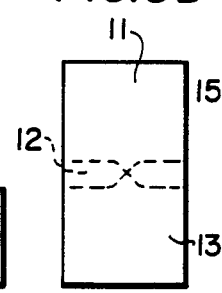
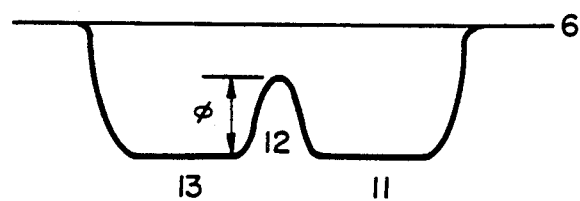
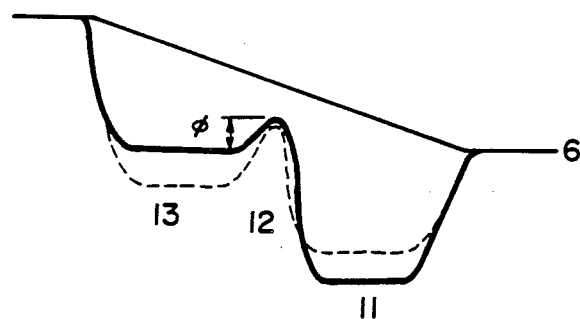
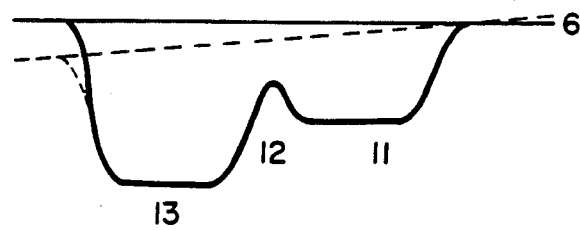

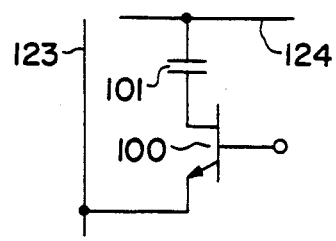
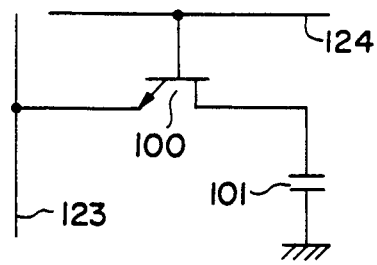
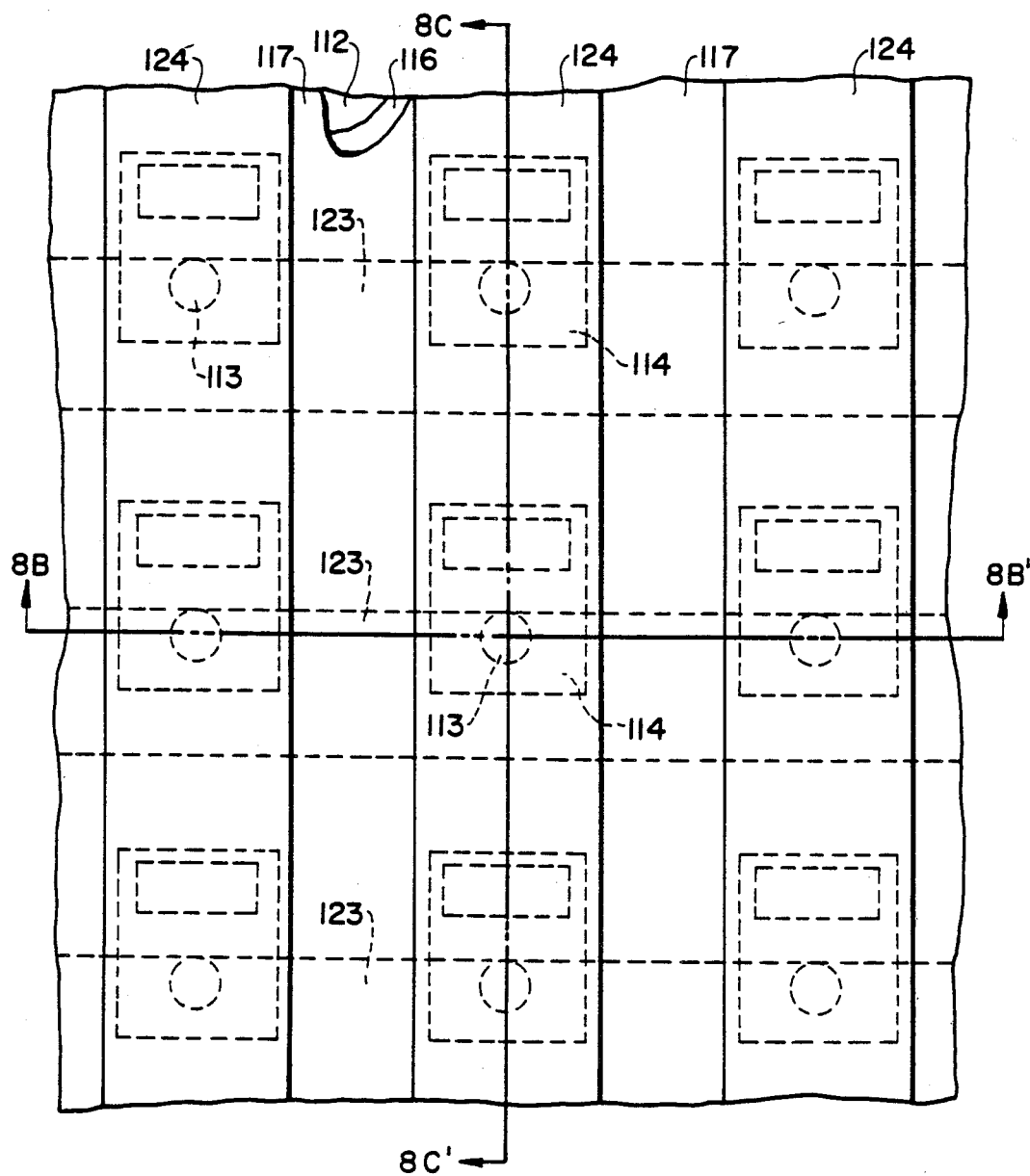

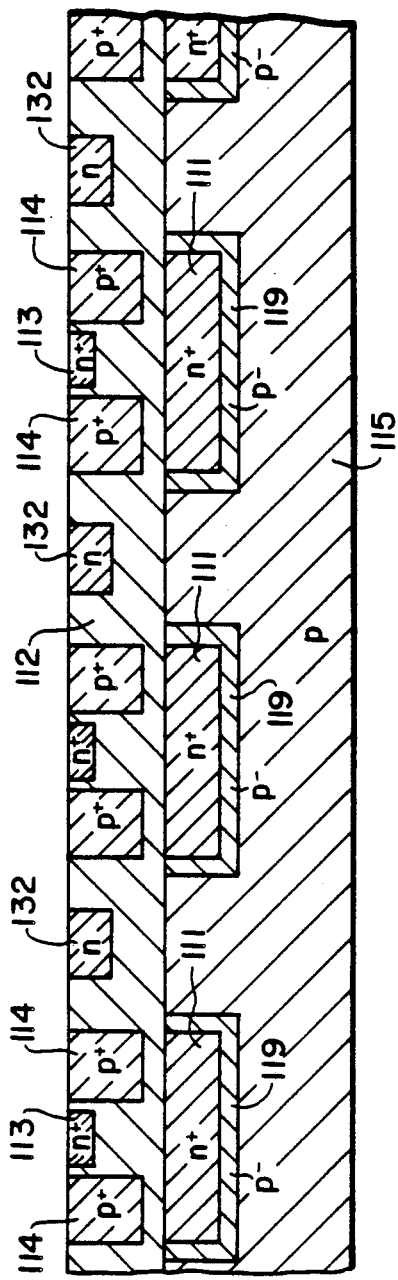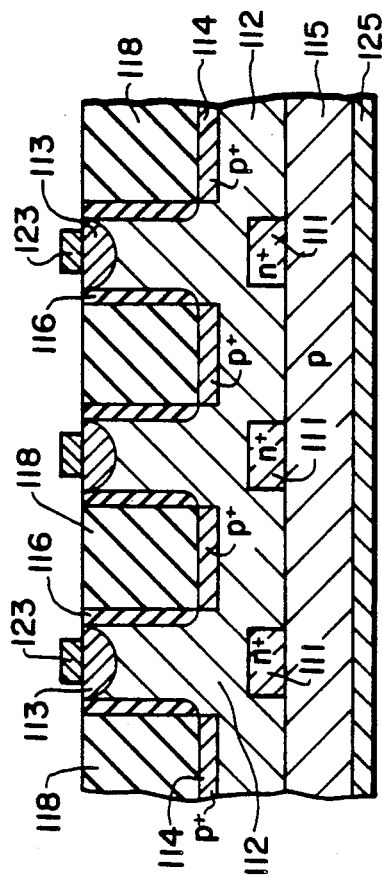

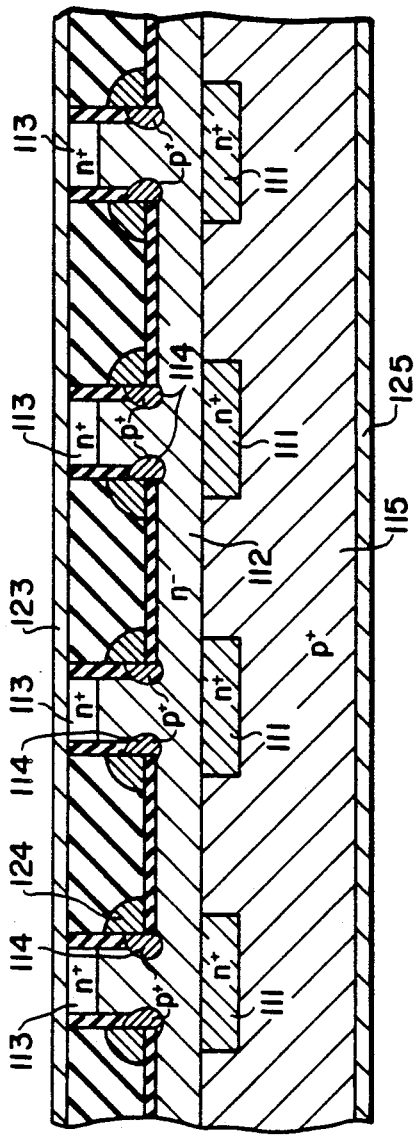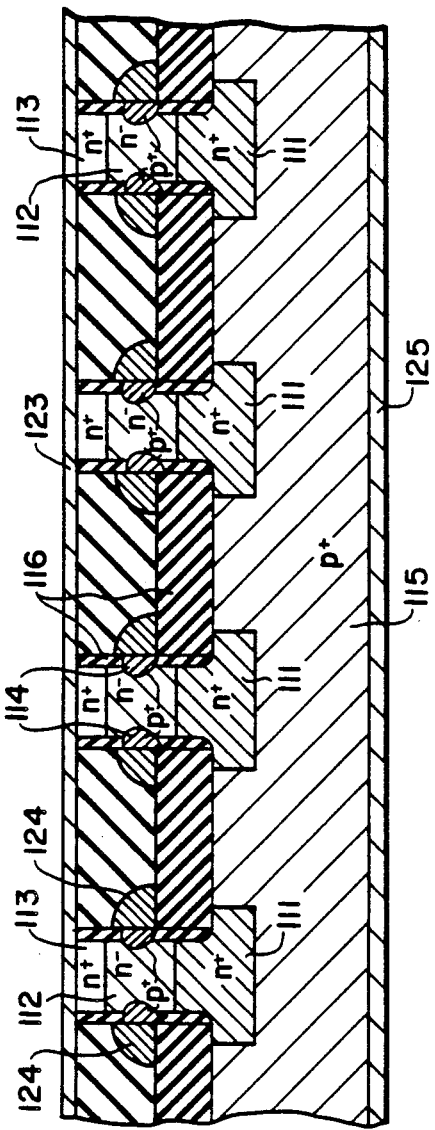

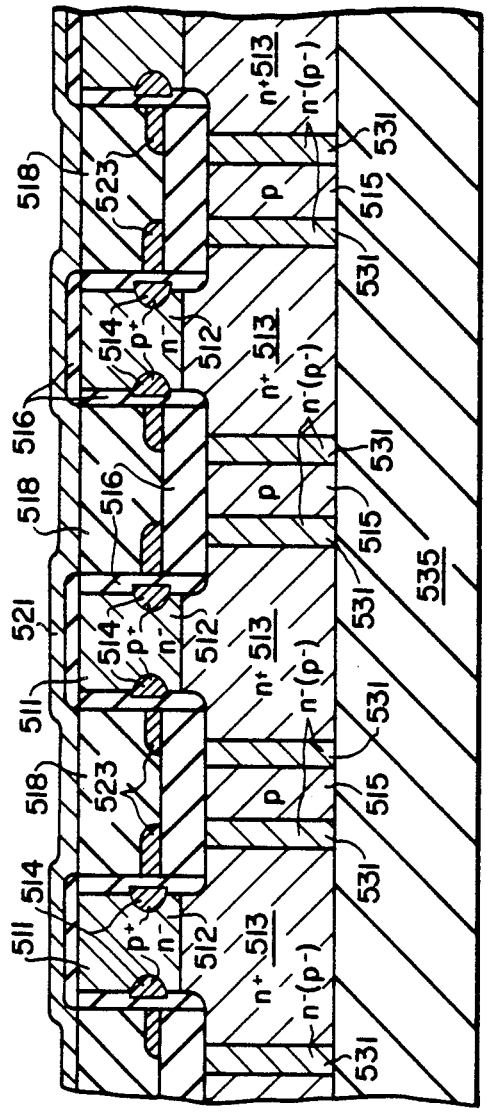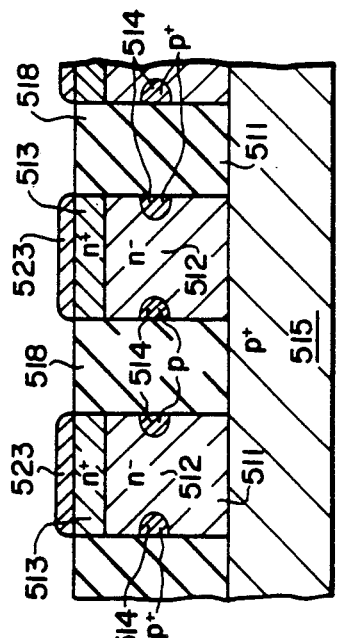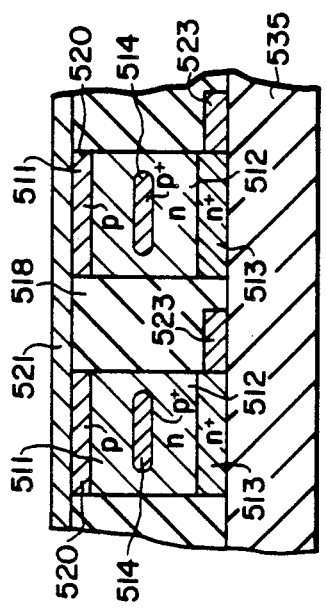

4,994,999

HIGH-SPEED AND HIGH-DENSITY SEMICONDUCTOR MEMORY

This is a continuation of application Ser. No. 514,595, filed July 18, 1983, which was abandoned upon the filing hereof; which was a continuation of Ser. No. 174,725 filed 8/4/80, now U.S. Pat. No. 4,434,433; which was a continuation of Ser. No. 878,441 filed 2/16/78, now abandoned.

BACKGROUND OF THE INVENTION (a) Field of the Invention

The present invention relates to a semiconductor memory, and more particularly it pertains to a high-speed and high-density semiconductor memory.

(b) Description of the Prior Art

Semiconductor memories are under development of higher integration density and larger capacitance. In random access memories (RAM), the density of 16 Kilobits per chip is now popular. As the integration density has increased to such a level, a reduction in the surface occupation area per memory cell will be required accordingly. In most of the 4 kilobit RAM's, one memory cell is formed with one lateral transistor structure, which in most of the 16 kilobit RAM's, the transistor structure is further simplified into the charge coupled type. In both cases, the basic concept or the equivalent circuit of a memory cell is "one transistor per memory cell" and this will not be simplified further. Namely, in a memory cell, there is a region for storing information, another region for extracting this information to the outside of the cell, and a further region between these two for controlling (or at least helps controlling) the transfer of the memory. Then, the integration density of memory cells in a semiconductor memory is determined largely by the surface occupation area of one transistor or the like which works as a memory cell. The so-called MOS FET type memory cell and the charge coupled device type memory cell can be roughly classified as the surface structure cell which inevitably accompany relatively large surface occupation area. Furthermore, since the electron and the hole mobilities in the surface of a semiconductor body (surface mobilities) are usually lower than those in the bulk (bulk mobilities) due to various surface state such as trapping levels (for example in silicon the surface mobility is about one third to one fifth of the bulk mobility), the carrier transit time becomes low in the surface region and the high speed-operation is at least partially limited thereby.

The inventory of the present invention has proposed a new type of field effect transistor (now called "static induction transistor") which has a low series (source to intrinsic gate) resistance and can show non-saturating drain current versus drain voltage characteristics disclosed in his U.S. patent application Ser. Nos. 817,052 and 576,541, and stated in "IEEE Trans. Electron Devices" ED-22, 185 (1975). The static induction transistor has many advantages such as that the gate parasitic gate (source-gate and gate-drain) capacitance is very small, that the gate region resistance can be very low, that charge carriers are drifted by an electric field and that the space charge storage effect is very small. Therefore, the application of the static induction transistor is of much interest in various fields. However, although some developments in the integrated circuits by the use of the static induction transistor have been made and proposed, there still is hardly any proposal with respect to the memory device.

SUMMARY OF THE INVENTION

Therefore, it is an object of the present invention to provide a high-density semiconductor memory device including a multiplicity of memory cells arranged in a matrix of rows and columns in a semiconductor bulk.

Another object of the present invention is to provide a high-speed semiconductor memory device.

A further object of the present invention is to provide a semiconductor memory device operable at a low power dissipation.

A yet further object of the present invention is to provide a random access memory device having a high integration density.

Still another object of the present invention is to provide a non-volatile random access memory device having a high integration density.

BRIEF DESCRIPTION OF THE DRAWINGS

FIGS. 5A to 5D are diagrammatic representations illustrating the basic concept of the memory cell according to embodiments of the present invention.

FIGS. 6A to 6C are energy diagrams in the memory cell of FIG. 5A in three operational states.

FIG. 7A is a fundamental equivalent circuit diagram of the memory cell according to an embodiment of the present invention.

FIG. 7B is another equivalent circuit diagram of the memory cell according to another embodiment of the present invention.

FIGS. 8A, 8B and 8C are a top plan view of a memory device according to an embodiment of the present invention, and cross-sectional views of the memory cell of FIG. 8A along the lines 8B—8B' and 8C—8C' in FIG. 8A.

FIGS. 9 to 12 are cross-sectional diagrams of memory devices according to respective embodiments of the present invention, in which a storage region is disposed in the bulk of a semiconductor body.

FIGS. 21A to 22 and FIG. 42 show memory devices according to further embodiments of the present invention capable of performing writing operation by the use of light, in which FIGS. 21A and 21B are cross-sectional diagrams of a memory device according to an embodiment, and FIGS. 22 and 42 are cross-sectional diagrams of another memory device according to another embodiment.

FIGS. 25A to 31 show simplified structures of the memory device according to further embodiments of the present invention, in which FIGS. 25A and 25B are a top plan view and a cross-sectional diagrammatic view of a memory device according to an embodiment, FIGS. 26 and 27 are cross-sectional diagrams of memory device according to respective embodiments, FIGS. 29 to 30 are cross-sectional diagrams of memory devices according to respective embodiments.

FIGS. 35 to 39 show memory devices of punch-through bipolar transistor type according to further embodiments of the present invention, in which FIGS. 35 and 36A are cross-sectional diagrams of memory devices, FIGS. 37 to 39 are cross-sectional diagrams of memory cells.

DETAILED DESCRIPTION OF THE PREFERRED EMBODIMENTS

To help understanding of the present invention, some conventional semiconductor memory cells will be described before proceeding to the description of the embodiments of the present invention.

Figure 1:
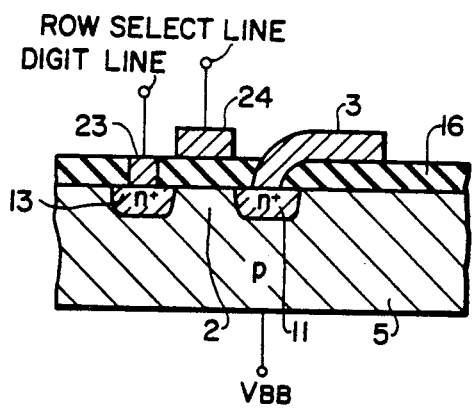
FIGS. 1 and 2 are cross-sectional diagrams showing examples of the conventional memory cell of one transistor/one cell type.

FIG. 1 shows a one transistor/one cell structure used in 4 kilobits dynamic random access memories. The transistor comprises an n+ type source regions 11 and an n+ type storage cell region 13 (which corresponds to the drain region) formed in a surface of a p type semiconductor chip 5. Between the source and the cell regions 13 and 11, a metal-insulator-semiconductor (MIS) gate structure is formed with a metal electrode 24, an insulating film 16 and the p type substrate 5. An inversion layer 2 may be induced by the gate voltage to connect the two n+ type regions. Since the capacitance accompanying the cell region 11 is not sufficiently large, a metal electrode 3 extends from the surface of the n+ type cell region to the outside of the transistor but separated by the semiconductor chip 5 by the insulating layer 16 so as to increase the capacitance of the cell. The source region 13 is connected to the digit line 23 or it is directly used as the digit line. The addressing gate electrode 24 is connected to the row select line. It will be apparent that this lateral transistor structure has a large surface occupation area.

Figure 2:
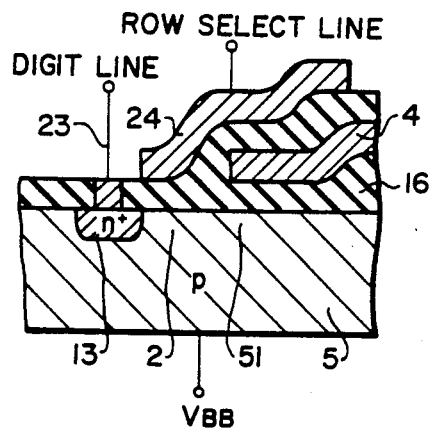

A reduction in the surface occupation area is accomplished by the provision of the surface charge (charge coupled) type double polycrystalline silicon structure as shown in FIG. 2. In the Figure, it can be seen that the doped cell region is eliminated, and another MIS type structure is formed. Namely, polycrystalline silicon electrodes 24 and 4 are disposed above the semiconductor surface through an insulating film 16 to induce inversion layers 2 and 51 thereunder. These regions 2 and 51 serve as the channel region and the storage cell region. In this structure, the surface occupation area of one memory cell is reduced by the double polycrystalline silicon structure.

Further but similar modifications of the memory cell structure are shown in FIGS. 3A to 3C and 4A to 4C.

Figure 3A:
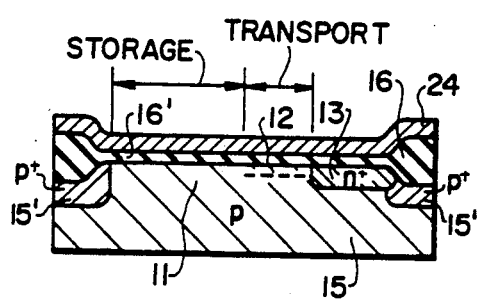
FIGS. 3A, 3B and 3C are a cross-sectional diagram of a conventional memory cell, and a diagrammatic representation of the change in the surface potential with respect to a voltage applied through an insulator film, and a diagrammatic representation of the surface potential distributions in the memory cell of FIG. 3A.

FIG. 3A shows a diagrammatic cross-section of a conventional memory cell. A bit line which is used for reading and writing data is formed with an n+ type stripe region 13 formed in a surface portion of a p type silicon substrate 15. An address line (a word line) 24 is formed with an electrode region 24 of metals such as aluminum (Al), molybdenum (Mo) or the like, or with a low-resistivity semiconductor such as doped poly-silicon or the like. An insulator layer 16, formed with silicon oxide or the like, is formed between the electrode region 24 and the substrate 15 to electrically separate the two. P type impurity ions such as boron (B) or the like are implanted in a surface region 12 of the p type substrate 15 located adjacent to the n+ type bit line region 13. Thus, the impurity concentration in the implanted region 12 is made higher than that of the other p type region 15 by about one order of magnitude.

Figure 3B:
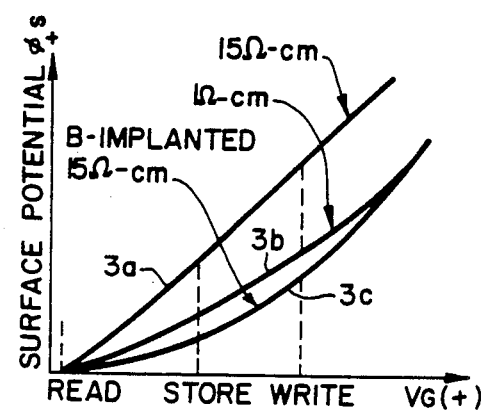
Figure 3C:
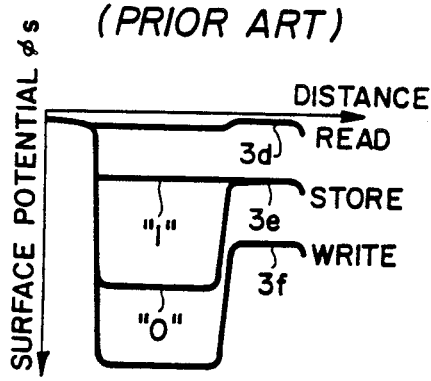

FIG. 3B shows the relation of the surface potential with respect to the electric voltage $V_G$ applied to the word line 24, and FIG. 3C shows surface potential distributions in the memory cell of FIG. 3A.

As mentioned with respect to 3A previously, when a semiconductor is comprised of a multiplicity parts of semiconductors having different impurity concentrations, for example if the concentration of the p type storage region 11 is different from that of the p type transport region 12 shown in FIG. 3A, the surface potential of the semiconductor will change with respect to the voltage applied to the word line. The characteristic curves of the surface potential vs. the voltage $V_G$ applied to the wording are shown in FIG. 3B. In FIG. 3B, curves 3a and 3b show the changes in the surface potential of a p type region having a resistivity of about 15 Ω-cm ($9 \times 10^{14}$ cm$^{-3}$) and of a p type region having a resistivity of about 1 Ω-cm ($9 \times 10^{16}$ cm$^{-3}$), respectively. There is also shown curve 3c which shows the change in the surface potential of a p type region having a resistivity of about 15 Ω-cm but being additionally implanted with p type impurity ions such as boron (B) as described above. As is shown in FIG. 3B, the change in the surface potential of a semiconductor becomes smaller with a decrease in the resistivity of the semiconductor. In FIG. 3C, curve 3f shows the surface potential distribution of the memory cell of FIG. 3A. When the word line 24 is applied with a voltage of about 10V, it can be seen that the surface potential $\phi_s$ in a storage region 11 is considerably elevated (i.e. potential being lowered for electrons) relative to the surface potential $\phi_s$ in the B-implanted transport region 12 and the bit region 13. Hence, electrons in the n+ type bit region are allowed to flow into the inversion (storage) region 11. Similarly, curve 3e shows the surface potential distribution in the memory cell when a smaller voltage, for example about 5V, is applied to the word line 24. There is shown a clearly defined potential well in the storage region 11. Thus, electrons having flown into the storage region 11 can be stored thereat, since the surface potential becomes sufficiently positive to attract and hold the electrons. When it is desired to read the data or retrieve the stored electrons out of the storage region 11, the potential of the word line may be decreased to or near the ground potential. Then, the surface potential distribution will become as shown by curve 3d, and hence the stored electrons can flow out of the storage region to the bit line 13 through the transport region 12. Therefore, the stored data can be read out of the memory cell in this manner. Practically, a memory device includes a multiplicity of memory cells disposed in a matrix. Thus, a plurality of memory cells are connected to a word line. Upon data having been stored into a memory cell, there are those cells, other than said memory cell, which are connected to the same word line but which should not be written. To prevent writing into such cells, the potential of the bit lines connected to such cells is also raised. For example, the bit line is held at the same potential as that of the word line.

Therefore, a electrons are unable to flow into the storage region of such cells out of the bit region. In this way, data are prohibited from being written into the non-desired cells. Memory cells are placed on cross points of word lines and bit lines. In the manner stated above, data can be arbitrarily written into desired memory cells and retrieved therefrom.

Figure 4B:
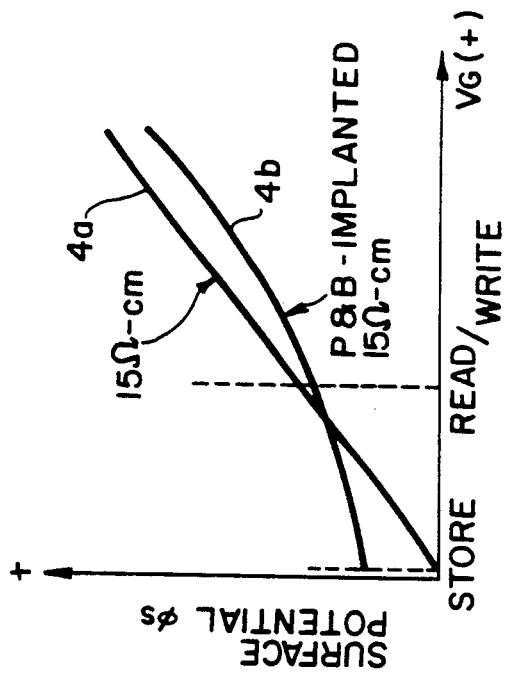
FIGS. 4A, 4B and 4C are a cross-sectional diagram of another conventional memory cell, and diagrammatic representations of the surface potential in the memory cell of FIG. 4A, analogous to FIGS. 3A to 3C.
Figure 4A:
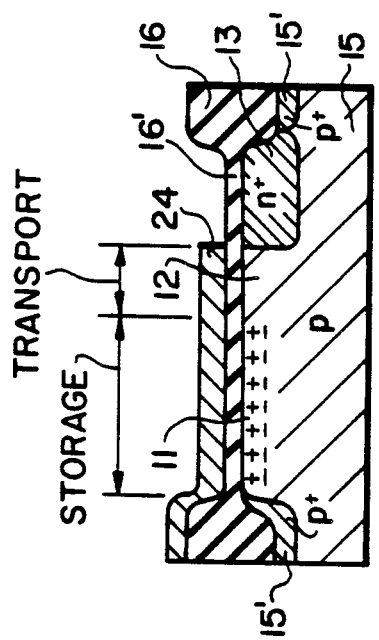
Figure 4C:
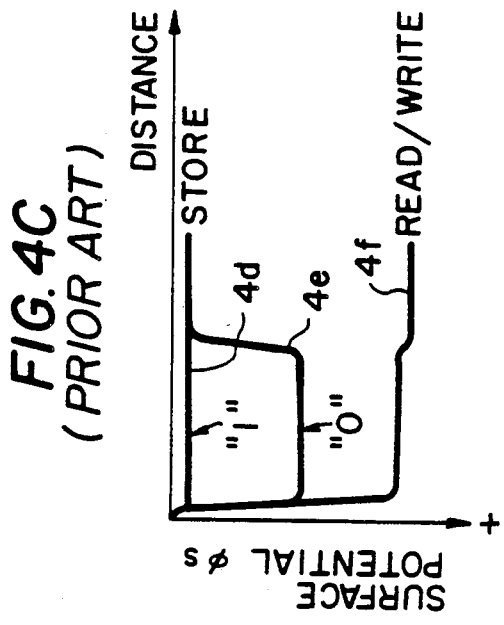

FIGS. 4A, 4B and 4C show a cross-section of another conventional memory cell, the relation of the surface potential vs. the voltage applied to the word line, and the surface potential distribution in the cell of FIG. 4A, respectively. The memory device shown in these Figures is also of the surface charge type, and FIGS. 4A, 4B and 4C are analogous to FIGS. 3A, 3B and 3C, respectively. In the memory cell illustrated in FIGS. 3A, 3B and 3C, three different voltages are selectively applied to the word line, which are respectively used for reading, storing and writing data. However, the memory cell shown in FIGS. 4A, 4B and 4C needs only two different voltages to be applied to the word line for the operations of reading, storing and writing. In FIG. 4A, boron (B) ions and phosphor (P) ions are implanted into the p type storage region, thus the flat band potential (which is the potential required to flatten the band bending near the surface) is changed, and the characteristic curves of the surface voltage with respect to the voltage applied to the word line becomes as shown by curves of FIG. 4B. When a voltage is applied to the word line for writing or reading data, the surface potential of the transport and the storage regions becomes higher than that of the bit region 13 to attract electrons. Here, although the surface potential of the transport region 12 is shown to be higher than that of the storage region 11, the difference when the voltage applied to the word line is lowered to be almost the same as the ground potential for the purpose of storing data, the surface potential of the storage region will become higher in the positive polarity to store electrons thereat. When the voltage $V_G$ applied to the word line is raised again, the electrons having been stored in the storage region flow out of the storage region 11 to the transport region 12. In this manner, data can be written, stored and read.

In these charge coupled (surface charge) type RAM, the surface occupation area of each memory cell can be reduced to some extent but still there is a limit for raising the integration density. Furthermore, since charge carriers are transported only in the surface portion of a semiconductor body, the low surface mobility limits the potential maximum operation speed.

The principal concept of the present invention is to utilize SIT structures as the memory cells. The SIT has extremely large potential for raising the integration density and the operation speed compared to the conventional transistors.

Furthermore, when the vertical type structure is employed as will be described in detail on various embodiments, the carrier transport is done substantially in the bulk of a semiconductor body. Thus, the operation speed can be enhanced due to the larger bulk mobility.

Namely, in the SIT structure, a potential barrier can be formed in the current path between the source and the drain. Here, the potential barrier is formed with a substantially depleted region both in the unipolar type structure and in the bipolar type structure. When one of the source and the drain regions is floated, it can work as a storage cell and a memory cell is formed thereby. Although there is no limitation in the point which of the source and the drain regions is to be floated, the floated region will be called the storage region and the other region will be called the source region or bit region, for simplifying the description. The floated storage region may be disposed either in the surface portion or in the bulk region. Indeed, both the source region and the storage region can be formed near the surface in a lateral structure. In such a case, however, the surface occupation area becomes large and the merits of the present invention is reduced. When the requirement for the amount of charge to be stored in the storage region is not large, the impurity concentration in the storage region may be selected the same as that of the channel region for simplifying the manufacture. It has been proposed that a substitute of the SIT can be formed with a bipolar type structure having a substantially depleted thin base region since a similar potential barrier can be formed by such base region. In this case, the operation principle is the same as above. In this bipolar type structure, also, the storage region may be formed with an inversion layer formed near the semiconductor surface.

More particularly, it is well known that when a semiconductor body having a certain impurity concentration (the term "semiconductor" should also include insulator of usual sense) is brought into contact with another body of different substance or of the same material but having a different impurity concentration or into contact with the ambient atmosphere, there is established a difference in contact potential which forms a potential barrier for electrons or holes. According to the present invention, a storage cell defined by such potential barrier is formed in a semiconductor body, and charge carriers are put into or taken out of this storage cell so as to accomplish memory operation. Here, the term "memory operation" includes writing, storing and reading. The region for supplying and retrieving charge carriers is called the source region. Between the source region and the storage region, there is established a potential barrier at least part of which is formed with a semiconductor region having the same conductivity type as that of the source region but having a low impurity concentration or with a semiconductor region having a conductivity type opposite to that of the source region but being substantially pinched off, thereby enhancing the efficiency and the speed of the carrier transport. Furthermore, the storage region and the source region may be arranged substantially perpendicular to the semiconductor surface to attain an improvement in the operation speed, integration density and the memory efficiency.

In one class of the memory device, the resistance from the source region to the storage cell in at least one of the reading and writing operations is made lower than the leak resistance. According to the present invention, there is a potential barrier between the source region and the storage region. Regardless of the type of the semiconductor region constituting this potential barrier, the height of the potential barrier is lowered by the voltage applied to the storage region or the source region to cause charge carriers to easily go over the potential barrier. There are several ways to increase the possibility of going-over of the charge carriers, such as: widening the width of the portion of low barrier height, decreasing the height of the potential barrier, and decreasing the width of the region of low drift field intensity.

FIGS. 5A, 5B, 5C and 5D are diagrams for explaining the operational principles of typical examples of the memory cell according to the present invention.

FIGS. 6A, 6B and 6C show three modes of potential distribution in a memory cell as shown in FIGS. 5A to 5D. FIG. 5A shows an example of a memory cell comprising an n+ type storage region 11, as n+ type channel region 12, and an n+ type source region 13 formed in the bulk of a p type substrate 15. Practically, the two n+ type regions may be formed in a p type substrate 15 of a high resistivity (i.e. low impurity concentration). At this stage, the built-in potential between the n+ type regions 11 and 13 and the p type substrate forms potential barriers which surround the two n+ type regions. Thus, conducting electrons are enclosed in the n+ type regions by the built-in potential. The region between the two n+ type regions 11 and 13 is formed with an n− type silicon region of a high resistivity, for example by diffusion or selective growth. At this stage, there also exists a built-in potential between the n− region 12 and the p type substrate 15 as well as between the n− type region 12 and the n+ type regions 11 and 13. The potential distribution in this memory cell is shown in FIG. 6A. The potential barrier is formed between the source region 13 and the storage region 11 and has a height $\phi$. Let us now suppose here that the storage region 11 and the source region 13 are arranged substantially perpendicular to the semiconductor surface (not shown) and that the storage region 11 is arranged on the surface side. When a positive voltage is applied to the semiconductor surface to raise the potential of the n+ type region 11 relative to that of the n+ type region 13, the applied voltage is mainly consumed in the depleted or high resistivity region to form a potential distribution as shown in FIG. 6B. The height of the potential barrier $\phi$ for electrons in the n+ type region 13 in the direction toward the n+ type region 11 is decreased and the electrons in the n+ type region 13 begin to flow over the potential barrier into the storage region 11. Then, the source region 13 becomes charged positively (shortage of electrons) and the storage region 11 negatively (excess of electrons) due to the current flow between the source region 13 and the storage region 11. Consequently, the potential barrier $\phi$ between the source region 13 and the n− type region 12 is increased, and the potential drop between the n− type region 12 and the storage region 11 is decreased. Thus, the potential distribution becomes as is illustrated by the dotted line in FIG. 6B. Therefore, the current flow becomes gradually decreased and finally ceases. If the voltage applied to the semiconductor surface is switched off during the process of charging, the storage region 11 is charged negatively and the source region is charged positively. Thus, the potential (for electrons) of the storage region 11 is higher than that of the source region 13, in contrast to the potential distribution in the charging process. This state is illustrated in FIG. 6C.

It can be seen that the source region and the storage region can be exchanged. Namely, the storage region stores free charge carriers in the above description, but the storage region may also be depleted (loose free charge carriers) in storing memory. In other words, either the excess of charge carriers or the storage of charge carriers may be used as the memory states. In this case, depending on the impurity concentration of the substrate 15 and also due to the effective range of the electric field established by these charges, the potential distribution will change from the solid curve to the dotted curve (which is the case of ideal insulator, i.e. infinite Debye length).

Considering the leak current from the storage region, it is not preferable that the high resistivity region extends too far to the outside the storage region into the substrate. For high-speed operation of a memory cell, it is important to decrease the capacitance accompanying the pn junction (i.e. to increase the depletion layer width), and thus it is effective to form a high resistivity layer adjacent to and around the n type regions 11 and 13. Furthermore, from the viewpoint of the manufacture of a semiconductor device, it is preferable to form the surrounding region with a semiconductor region of a uniform impurity concentration. There exists an optimum impurity concentration of the substrate for a semiconductor device of a certain (desired) operation speed. In the memory cell structures shown in FIGS. 5B, 5C and 5D, the prevention of the leak current is improved. In FIGS. 5B and 5C, the interconnecting channel region 12 is made narrower compared with at least one of the storage region and the source region. In FIG. 5D, the interconnecting channel region 12 is formed in such a way as will establish the so-called "normally off" structure wherein the carriers are flown through the central region of the channel region 12 which is opened by the writing voltage and then closed after the storage of charge carriers which is effected by switching off the writing voltage.

The reading of the stored memory can be done in various ways. The most simple way is to extend the source region to the outside and to detect the presence or the absence of a current when a reading voltage is applied. Referring to FIG. 6C, it can be seen that the effect of the stored charge extends to the outside of the storage cell 11, typically to the Debye length. Therefore, when a sensor which is sensitive to an electric field or voltage is positioned near the storage region within the Debye length, it is possible to sense the stored information nondestructively. For example, an FET or SIT may be disposed near the storage region 11 within the Debye length to detect the change in resistance, by the electric field. Alternatively, a semiconductor diode may be connected between the source and the storage regions in such a manner that the stored charge will not flow through the diode. For example, when the storage region is formed with an n+ type region and stores electrons, the anode of a diode is connected to the storage region. In such a case, a reading pulse of the negative polarity will be applied to the source region. When there is no memory (no excess electrons) in the storage region, the reading pulse will establish a forward field across the diode and a current is allowed to flow. When there is a memory (excess electrons) in the storage region, the reading pulse only decreases the reverse field across the diode and no current is allowed to flow. Thus, a non-destructive reading can be accomplished by sensing the absence of a current. Various conventional methods can be employed for reading the stored memory. One of the most effective reading for enhancing the integration density and the discrimination ability is to apply an electric field opposite in direction to that used in the storing process. The memory can be read out by sensing the back flow of the current from the storage cell 11 to the source region 13 through the current or static coupling. In this case, unless the memory is read out at a very small current, the reading process is destructive. Another destructive reading is the method in which a reading voltage of the same polarity to that of the storing voltage is applied to the storage cell and the absence or a reduction in the current is read out as no memory storage.

As can be seen from the above description, the basic principle lies in memorizing whether the charge is on one side cell or on the other side cell. It may be called ping-pong or volley-ball memory. As an alteration of this ping-pong memory, one side cell may be held at a common voltage and the voltage of the other cell or a current flow from the other cell may be detected to sense the stored information. Also there are many variations of such ping-pong memory as will be apparent for those skilled in the art.

Now, concrete embodiments of the present semiconductor memory will be described hereinbelow.

FIG. 7A shows a basic equivalent circuit applicable to most of the following embodiments. Namely, a capacitance 101 is connected to one of the current electrodes (shown to be the source region in the figure) of a static induction type field effect transistor 100. A gate of the transistor 100 is connected to the address line 124 and a source is connected to a digit line 123. The capacitance 101 is at least partially formed of the drain capacitance. The gate of the transistor 101 may be floated or kept at a constant voltage and the addressing may be achieved by changing the ground potential relative to the digit line as in FIG. 7B. Apparently, p-channel type transistors can be used equally as well as n-channel type transistors, provided that the polarity of voltage are reversed. Furthermore, the static type transistor 100 also be formed with a punch-through type bipolar transistor having a substantially pinched off base region.

Figure 8B:
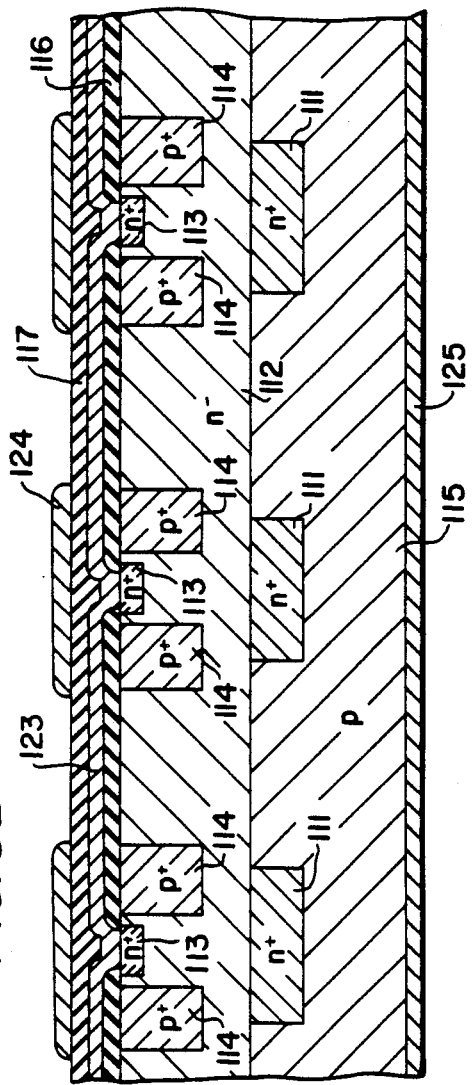
Figure 8C:
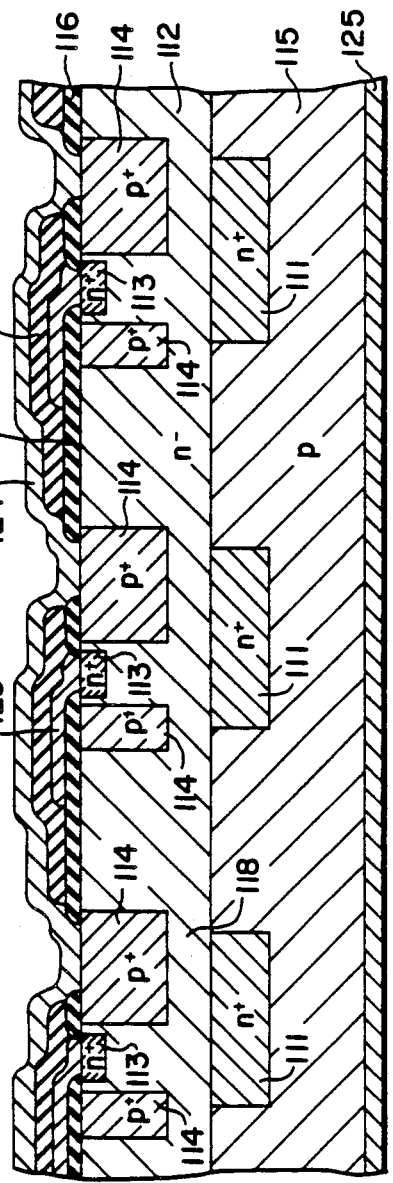

FIGS. 8A to 8C diagrammatically show a semiconductor memory device. FIG. 8A is a top view, and FIGS. 8B and 8C are cross-sections along lines 8B—8B' and 8C—8C' in FIG. 8A. The structure is partially exaggerated. Similar exaggeration will be employed in most of the structural Figures. In the surface of a p type substrate 115, n+ type regions 111 are formed. Each of these n+ type regions 111 is floated, and serve as the storage region. On the substrate 115, an n− type layer 112 is formed. Another n+ type source regions 113 and p type gate regions 114 surrounding the n+ type regions 111 are formed in the n− type layer 112. It can be seen that the gate regions 114 do not reach the substrate 115 but do extend close to the substrate 115. Electrodes 125, 123 and 124 are formed to contact the respective semiconductor regions 115, 113 and 114. An insulating film 116 covers the semiconductor surface excepting the electrode contact areas, and another insulating film 117 insulating the crossing gate electrodes (word lines) 124 and the source electrodes (bit or digit lines) 123. The word lines and bit lines may be formed with any conducting material such as metal or doped semiconductor. Similarly, the insulating layers 116 and 117 may be formed with any insulating material such as silicon oxide, silicon nitride, aluminum oxide, polyimide or with any material having a high resistivity. Selection of the material for the insulators and electrodes are determined according to the intended purposes. Each combination of the n+ type source region 113, the p+ type gate region 114, the n− type channel region 112 and the n+ type storage (drain) region 111 constitutes a static induction transistor. The storage region 111 forms a pn junction with the p type substrate, and hence it bears a capacitance (cf. FIG. 7). When the depletion layer extending from the gate region 114 pinches off the channel region 112 and electrically isolates the storage region 111 from the source region 113 and also from the neighboring cells (depletion layer touching the p type substrate), the storage region 111 will form a floating electrode and can store charge.

Typical impurity concentrations in the respective regions when the seniconductor is silicon are as follows; about $10^{17}$ to $10^{21}$ cm$^{-3}$ for the storage region 111, about $10^{10}$ to $10^{16}$ cm$^{-3}$ for the channel region 112, about $10^{18}$ to $10^{21}$ cm$^{-3}$ for the storage region 113, about $10^{15}$ to $10^{21}$ cm$^{-3}$ for the gate region 114, and about $10^{14}$ to $10^{18}$ cm$^{-3}$ for the substrate 115. The width (diameter in this embodiment) of the channel region 112 surrounded by the gate region 114 is determined mainly by the impurity concentration of this channel region 112 in such a manner that the channel is perfectly pinched off to establish an "off" state even only by the built-in potential between the gate and the channel. More particularly, it is so selected that even when charge is stored in the storage region 111 (which is the storage capacitor) to raise the potential of the storage region 111 to a certain height, the carriers do not travel over the potential barrier. The polarity of charge to be stored in the storage region may be plus (shortage of electrons) or minus (excess of electrons). For example, when the n− type channel region has an impurity concentration of $1 \times 10^{13}$ cm$^{-3}$, $1 \times 10^{14}$ cm$^{-3}$, and $1 \times 10^{15}$ cm$^{-3}$, the width of the channel is preferably selected at certain values less than 20 μm (micrometers) 6 μm and 2 μm. The distance between the source region 113 and the storage region 111 is shorter the better for shortening the carrier transit time in the writing and reading operations. Typical values of this source-storage distance extend about 1 to 15 μm. Referring to FIG. 7, the storage capacitance is formed with the junction capacitance between the storage region 111 and the substrate 115.

In writing data, a predetermined positive voltage is applied to the bit line 123. Then the height of the potential barrier established by the depletion layer extending from the gate region 114 is pulled down to let electrons in the storage region flow into the source region 113. As the electrons flow out of the storage region 111, the storage region become positively charged up. Thus, the potential of the storage region 113 becomes positively high. The flow of electrons will cease when the write-voltage and the storage cell potential balance each other. When the write-voltage is switched off, the channel 112 recovers a sufficient potential barrier and the storage region 113 is held charged.

The addressing of the writing operation may be accomplished in the following manners. When the channel width is sufficiently small and the impurity concentration in the channel region 112 is sufficiently low, a potential barrier of sufficiently large height is generated in the channel. Writing operation cannot be accomplished simply by applying a positive voltage to the bit line 123 since the height of the barrier cannot be decreased sufficiently. In such a case, simultaneously with the application of a positive voltage to the bit line 123, a more forward (higher positive) voltage is applied to the word line 124 (hence, to the gate region 124) is not applied with the forward voltage. Here, the voltage applied to the word line 124 is selected at such value as will cause the barrier height to be sufficiently lowered but will not cause any appreciable injection of minority carriers. On the other hand, when the channel portion 112 has such a width and an impurity concentration that will cause a sufficient flow of electrons to be attained simply by applying a positive voltage to the bit line 123, in this case, a reverse bias voltage may be applied to the gate region 114 through the word line 124 for those memory cells to which data should not be written in. It can be seen that, in the writing operation, the SIT structure is inversely operated since the region 113 is called "source region" in this specification.

The reading operation may be accomplished as follows. In the case of a high barrier height (former case), a predetermined negative voltage is applied to the bit line 123 (hence to the region 113) and a forward (positive in this embodiment) voltage is applied to the word line 124 (hence to the gate region 114). Then, electrons are allowed to flow from the source region 113 to the positively charged storage region 111. The presence or the absence of current in this reading process is detected to sense the stored memory. In the case of a lower barrier height (latter case), reading is accomplished by applying a predetermined negative voltage to the bit line. A reverse (negative in this embodiment) bias voltage is applied through the word line 124 to the gates of the memory cells which should not be read.

In the structure shown in FIGS. 8A to 8C, when the potential of the storage region 111 becomes high, the depletion layer may gradually extend into the substrate 115, and the capacitance may decrease. If such change in capacitance is very undesirable, a high resistivity region 119 may be disposed between the storage region and the substrate as shown in FIG. 9. The conductivity type of such high resistivity region 119 may either be $p^-$ or $n^-$. In the structure of FIG. 9, however, the capacitance of the pn junction between the storage region 111 and the substrate 115 should inevitably decrease.

In FIG. 9, separating n type regions 132 are also provided between the gate regions 114 of adjacent memory cells. Such separating regions will prevent possible punch-through current between the gate regions 114 of the adjacent memory cells, and can be provided in any of the embodiments disclosed in this specification.

FIG. 10 shows a recessed (or cut-away) gate structure in which a gate is formed in a recessed or cut-away portion of a semiconductor region 112 so that the depletion layer extends very deep into the channel to substantially the midway portion of the channel length extending from the source 113 to the drain (storage region) 111. In the Figure, recessed portions are formed in the $n^-$ type region 112, and the gate regions 114 are formed in the bottom portions of these recessed portions, whereas the source regions 113 are formed in the top portions of the protruding $n^-$ type region 112. The $n^-$ type region 112 is formed on top of a p type region 115, and storage regions 111 are formed in the $n^-$ type region 112 and on the p type region 115. The exposed side wall portions of the protruding portions of the channel region which will be seen in FIG. 10 are covered with an oxide layer 116 for passivating the surfaces. The recessed or cut-away portions 118 are filled with an insulating material such as polyimide or high resistivity polycrystalline silicon. In the channel portion of the $n^-$ type semiconductor region 112, there is established a potential barrier by the depletion layers extending from the gate regions 114. A source electrode 123 is formed on the source region 113 and extends perpendicular to the sheet of drawing to form column electrodes (note: the electrodes are arranged in a row-and-column matrix). Gate electrodes are not shown. The storage region 111 may also be formed in the p type region 115 and adjacent to the channel region 112. In such an instance, the distance between the $p^+$ type gate region 114 and the p type region 115 should be arranged to be small enough to isolate the respective memory cells (transistors) by the depletion layers extending from these p type regions 114 and 115. A small positive voltage may be applied to the p type region 115 in the storing state. If, however, some extent of decrease in the integration density is allowed, the cell-to-cell distance may be increased to increase the resistance of the $n^-$ type region which is located between the adjacent storage cells 111.

FIG. 11 shows diagrammatic cross section of a further embodiment of the recessed gate structure in which the $p^+$ type gate region 114 is formed only in a part of the side wall or the corner portion of the bottom of the recess. This cross-section of FIG. 11 is taken along the column electrode 123. A gate (row) electrode 124 is formed on the gate region 114 which surrounds the channel region 112. The gate electrode 124 extends perpendicular to the sheet of drawing. The bottom surface of the recess ($n^-$ type region 112) is covered with an oxide layer or with an appropriate insulating layer. Other portions are similar to the preceding embodiment. It will be apparent that the row (gate) electrode can be extracted on the surface of the insulator region 118 which fills the recess. This embodiment is effective to further reduce the gate capacitance (gate-source and gate-drain (storage cell) capacitances). Therefore, further improvements in the operation speed and in the reduction of the power dissipation become possible. Selection of the dimensions and the impurity concentrations of the respective regions may be almost similar to that of the embodiment of FIGS. 8A to 8C. According to this instant embodiment, the gate-to-gate punch-through between the adjacent memory cells is almost perfectly eliminated.

FIG. 12 shows a yet further embodiment of the recessed gate structure, in which the recessed portion touches the substrate. The $n^+$ type storage region 111 is formed in the $p^+$ type substrate 115 and the $n^-$ type channel region 112 is formed on the $n^+$ type storage region 111. The surface of the $p^+$ type region 115 is covered with a thick insulating layer 116 excepting those portions which are continuous to the $n^-$ type channel region 112. According to this embodiment, almost no punch-through current is allowed to flow between the adjacent gates and between the gate and the substrate. Furthermore, since the charge stored in the storage region 111 can hardly leak away, desired voltages can be applied to the respective electrodes. More particularly, applied voltages and charged voltages can amount up to such levels as will not exceed the level above which will occur breakdown between the respective regions. This can lead to a wider dynamic range which may be adapted for analog memory. The source-gate and the gate-drain capacitances are further reduced to enhance the speed of the writing and reading operations. In each memory cell, the gate region surrounds the channel region. The cross-section of the channel region may be of any shape, for example, circular, oval, square and rectangular. Other respects than those described above are similar to the foregoing embodiments.

Data storing can be done in both the analog and the digital manner. When the writing voltage which is applied to the bit line is fixed, a constant charge is stored in each memory cell, and the memory cell works as a digital memory. When the writing voltage on the bit line is varied, the charge which is stored in the storage region is also varied. The charge which is stored in the storage region naturally will become large as the writing voltage is increased. The storage cell potential in the storing state also will become high. As the writing voltage is decreased, the storage charge and the storage region potential will decrease also. When the data is read out by applying a constant voltage to the bit line, a current proportional to the stored charge (storing voltage) flows. Thus, analog reading can be done. The semiconductor memories described above can be used as analog memories and also as digital memories. For example, in the case of image memory, the brightness at each spot is classified into 16 grades and memorized. In a digital system, in general, each signal is digitalized in an AD converter into a 4-bit signal and memorized in four 1-bit memories. Thus, four memory cells are required for memorizing 1 spot. If the signal is raised to have 256 grades, i.e. 8 bits, eight memory cells per spot will be required, and furthermore the structure of the AD converter will become more complicated and delicate. If, however, the memory cells of the preceding embodiments are used for the image memory, one spot can be memorized in one memory cell. Even when the brightness of each spot is varying with time, memory can be done only with a sampling and holding circuit without the need of an AD converter. In this way, the memory devices of the preceding embodiments are quite suitable for analog memory of image, sound, and the like. Furthermore, carrier transport is accomplished in the bulk and also in an electric field, the writing and reading speed becomes very high, because of the inside mobility is high and because of the electric field applied. Yet further, since the cell structure is perpendicular to the semiconductor surface, the surface occupation area of one memory cell can be reduced. It is very easy to form each cell in a 10 $\mu$m square size, and hence a capacity of 1 Mbit/cm$^2$ is easily acquired. Thus, a high speed and large capacity analog memory can be provided.

Figure 13:
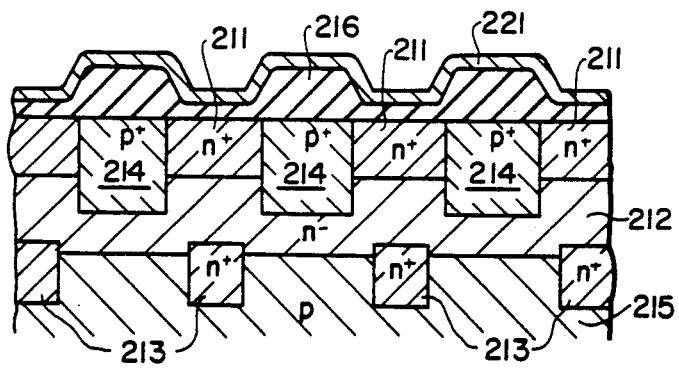
FIGS. 13 to 18 are cross-sectional diagrams of memory devices according to respective embodiments of the present invention, in which a storage region is disposed near the surface.

In the foregoing embodiments, the storage region is formed in the bulk of a semiconductor body, i.e. below the surface region. However, similar effects can be provided by reversing the positions of the source region and the storage (drain) region as can be easily seen also from the fact that the functions of the source and the drain are reversed in the writing and reading operations. Description will be made on the embodiments in which the storage region is positioned in the surface portion. FIG. 13 shows a diagrammatic cross-section of a semiconductor dynamic memory according to an embodiment of the present invention. The n+ type storage region 211 is formed on the upperside of the channel region 212, and the metal or conductive layer 221 is formed over the storage region, whereas the insulator layer 216 is formed between the metal layer 221 and the storage region 211, thereby forming a metal-insulator-semiconductor (MIS) structure. The n+ type source region 213 is embedded in the p type substrate and forms a so-called column of memory cell matrix, while the metal layer 221 forms a so-called row of the matrix. The side surface of the storage region 211 and part of the n− type region 212 is defined by the p+ type gate region 214. The n− type high resistivity region 212 (this region may be on intrinsic semiconductor region) is formed between the storage region 221 and the source region 213. That part of the n− type region 212 which is effectively surrounded by the gate region 214 (shown by dotted line) provides an effective current channel having a potential barrier for controlling the current flow between the storage region 211 and the source region 213. This potential barrier can also be formed without the use of a high resistivity region, if the width of the channel region between the storage region 211 and the source region 213 is narrowed, and if the bottom surface region of p+ type gate region 214 is enlarged. Namely, the height of the potential barrier at the center of the channel is defined by the impurity concentration and the dimensions (particularly the width) of the channel region. Indeed, the high resistance of the narrowed (and could also be long) current channel may also serve to preserve the stored charge.

When it is desired to write data into the memory cell, the potential of the storage cell 211 may be lowered through the potential of the metal layer 221, and the potential of the gate region 214 is arranged so as to control the height of the potential barrier of the channel region between the source region and the storage region. In this way, the depth and the width as well as the height of the potential barrier are controlled, and thus electrons in the source region 214 may flow through the channel region 212 into the storage region 211 to negatively charge up the storage region. Among the cells in the same column (the same word line), there may exist those cells during the writing operation wherein electrons are not desired to be stored, i.e. the cell into which data are not desired to be written. For preventing the writing of data into such cells, it is necessary that not writing voltage be applied to those gate region 213 corresponding to such cells so that any current cannot flow between the source region 214 and the storage region 211. Therefore, the writing operation can be selectively done among the memory cells. As is described previously, the storage region may lose charge carriers (meaning depletion) instead of storing charge carriers (meaning accumulation). Indeed, the polarity of the voltage on the bit lines should be reversed. During the state of data storing, the potentials of all the electrode regions, i.e. the potential of the source region 213, that of the gate region 214 and that of the metal region 221, may be set at the ground potential or at a "cut-off" potential. The electrons stored in the storage region 211 in this holding state cannot flow out of the storage region 211. When it is desired to read data out of the storage cell, the gate voltage is applied to the gate region 214 so as to control the channel region 212. That is to say, the height of the potential barrier in the channel region 212 is decreased by the controlling voltage applied to the gate region 214. If necessary in some case, the potential of the source region 213, and hence the part of the high resistivity region in the vicinity of the source region 213, may be decreased. In the above-stated manner, the electrons stored in the storage region 211 can flow out of the storage region 211 through the channel region 212 into the source region 213, whereby data can be read out of the memory cell.

In the above embodiment, the storage region 211 is arranged to directly contact the gate region 214 in order to increase the capacitance of the memory cell. However, there is some possibility of carrier recombination at the pn junction between the storage region and the gate region upon storing electrons in the storage region. There is, however, almost not problem when the stored electrons are extracted or when holes are accumulated.

Figure 14:
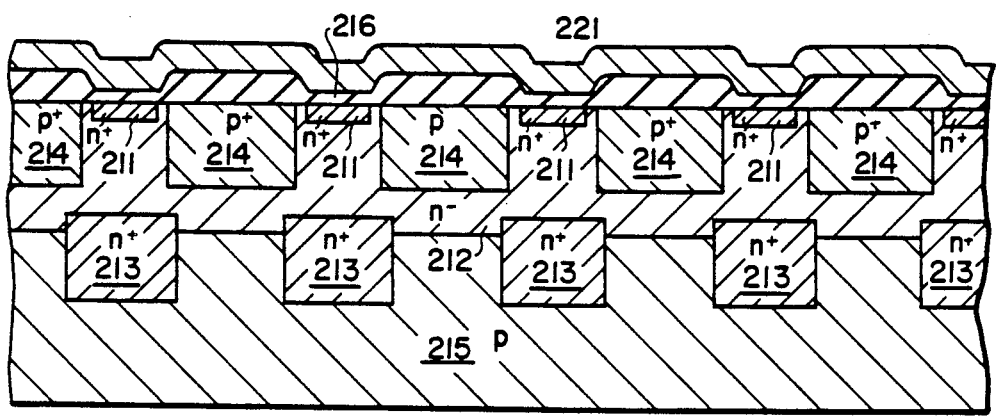

It will be apparent that when the capacitance of the bit line (or digit line) and the swing of memory voltage are given, the charge to be stored in each storage region and the required capacitance of the memory cell are also determined. For increasing the packing density, the area which is occupied by one memory cell having such a required capacitance as stated above should be reduced. For this purpose, the storage region preferably has as a broad surface as possible. Thus, the storage region defined by the gate region as shown in FIG. 13 is advantageous to increase the packing density although it is accompanied by the possibility of carrier recombination. FIG. 14 shows a diagrammatic cross-section of a dynamic random access memory according to another embodiment of the present invention. The memory cells are formed with a n+ type source region 213 which is embedded in a p type substrate 215, an n− type layer 212 lying over the substrate 215, a p+ type gate region 214 in the n− type layer 212, and an n+ type storage region 211 of a high impurity concentration located in the surface of the n− type region 212. The n− type region 212 forms respective current channels in those portions defined by the gate regions 214. A potential barrier is established in the channel. In this description, it should be understood that, in order to indicate the above stated channel region, the expression "n− type channel region 212" will be used. A metal layer 221 is formed over the storage region 211 through the insulator layer 216 to form a MIS structure. This metal layer corresponds to a so-called row of memory cell matrix, while the n+ type source region 213 corresponds to a so-called column of matrix. The storage region 211 is separated from the gate region by the n− type region 212, thereby preventing carrier recombination when electrons begin to be stored.

As the potential of the n+ type storage region 211 is lower than that of the n− type region 212, electrons injected from the source region (bit line) 213 flow into the storage region 211. As mentioned above, if a positive voltage is applied to the metal layer 221 (the word line), the voltage of the storage region 211 will become higher in the positive polarity than that of the source region 213 (bit line), and thus electrons are allowed to flow into the storage cell and are stored therein.

The operational behaviour of the device of FIG. 14 for writing, storing and reading the memory cell is substantially the same as that described in connection with FIG. 13. Thus, further description is dispensed with. However, the storage cell 211 of FIG. 14 has not contact with the surface of the gate region 214, and this means that the recombination of the stored electrons with holes in the gate regions 214 can be extremely reduced. Therefore, the carrier loss due to recombination can be suppressed extremely low. If necessary, in the storing state, the p+ type gate region 214 may be given a small negative voltage to effectively hold the storage and to obtain a high performance of the device.

Figure 15:
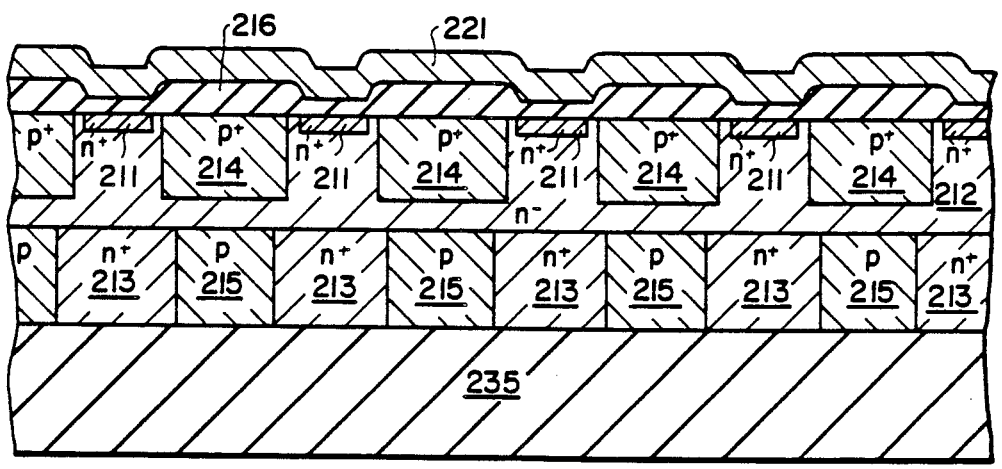

FIG. 15 shows a diagrammatic cross-section of a dynamic random access memory according to another embodiment of the present invention. The memory device comprises an insulator substrate 235, an n+ type source region 213 and a p type isolation region 215 formed adjacent to each other on the substrate 235, an n− type region 212 formed thereon, an n+ type storage region 211, and a p+ type gate region 214. The expression "channel region" will be used here also as in FIG. 14. The insulator substrate brings about the advantage that the capacitance formed between the source region and the substrate can be decreased, and hence the operation speed of the device for writing and reading memory cells can be increased. The insulator material for the substrate 235 may be sapphire, spinel or the like.

Figure 16:
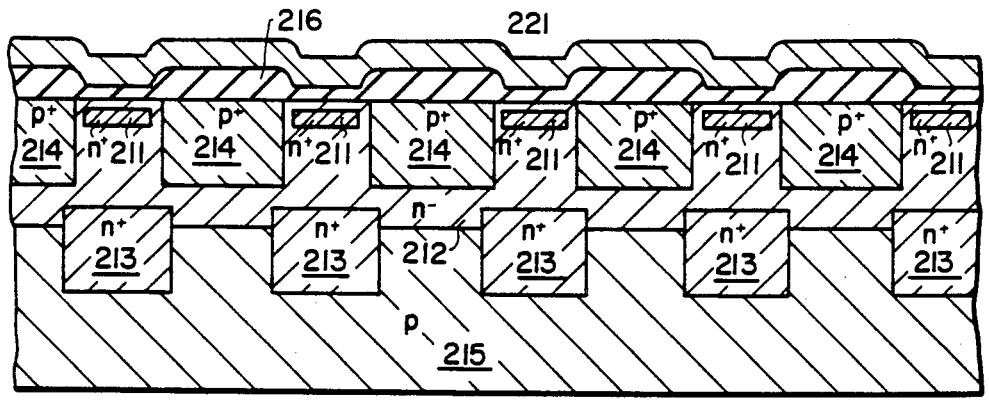

FIG. 16 is a variation of a semiconductor dynamic random access memory according to another embodiment of the present invention. The constituent components of the memory device are almost the same as those of FIG. 14. The manner of operations of writing, storing and reading the memory cell is also substantially the same as that of FIG. 14. However, in FIG. 16, the storage region 211 is formed to have such a structure that the surface of the storage region does not appear on the semiconductor surface, and that hence does not contact the insulator layer 216. This gives the advantage that degradation of the operational characteristics of the device to the recombination of electrons and holes in the vicinity of the surface of the storage region 211, if any, is reduced.

Figure 17:
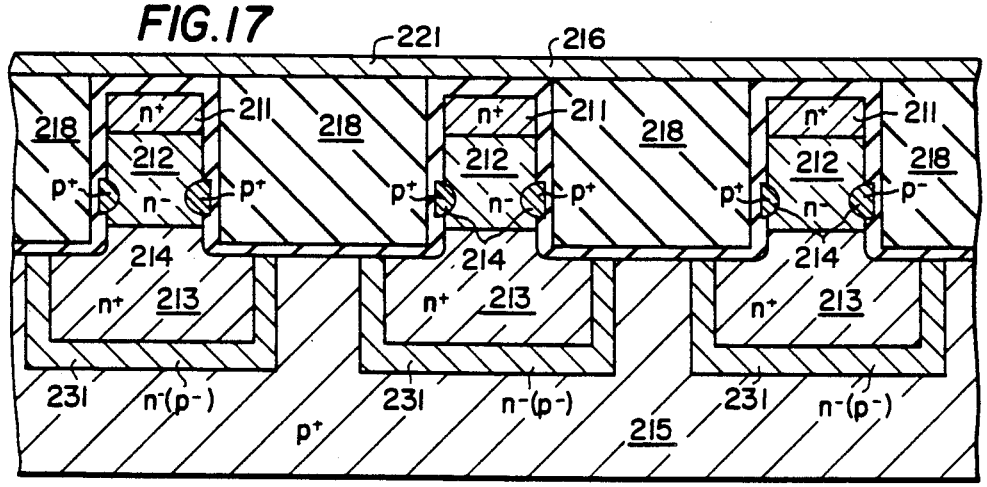

FIG. 17 shows a diagrammatic cross-section of a recessed-gate type dynamic random access memory according to another embodiment of the present invention. In this structure, a p+ type semiconductor substrate 215 is used. An insulator region 218 fills the recessed region between the storage regions 211, and it is provided for avoiding such current as the punching through current and the like which may flow between the bit lines 213 (the source regions 213). The gate region 214 is floating and forms a potential barrier in the current channel only by the built in potential. The source region 213 is surrounded by an n− (or p−) type region 231, thus the capacitance between the source region 213 and the substrate 215 is reduced. Reduction in the bit line capacitance leads to a smaller cell capacitance, and hence to an increase in the packing density.

Figure 18:
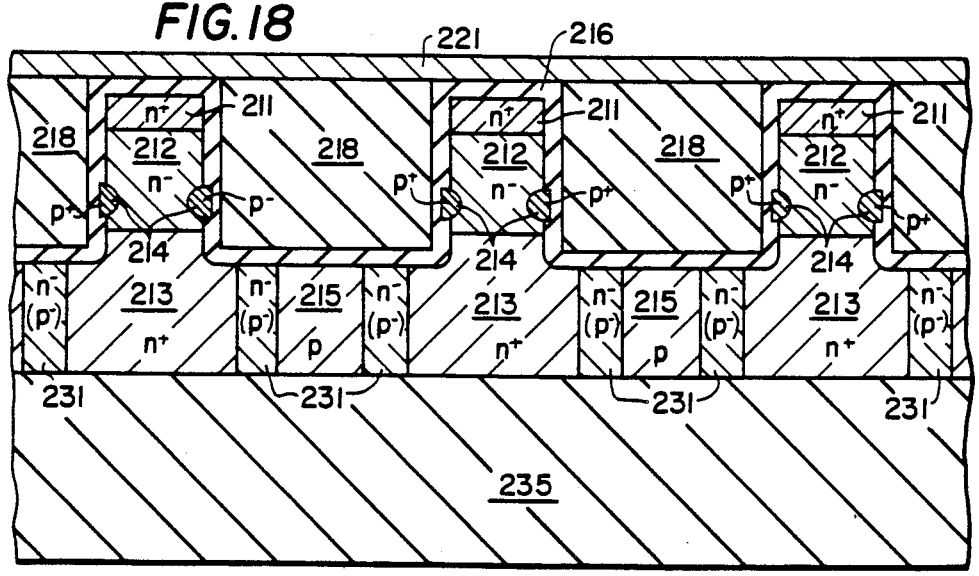

FIG. 18 shows another example of a semiconductor memory device which employs an insulator substrate 235. This structure is almost similar to that of FIG. 17, excepting the insulating substrate 235.

As described previously in connection with FIG. 15, the insulator substrate brings about the advantage that the capacitance between the source region 213 and the substrate 235 is reduced, and therefore the operation speed of the memory cell is increased. The operational behaviour of the device is almost the same as that of FIG. 17. Therefore, further explanation will be eliminated.

Figure 19A:
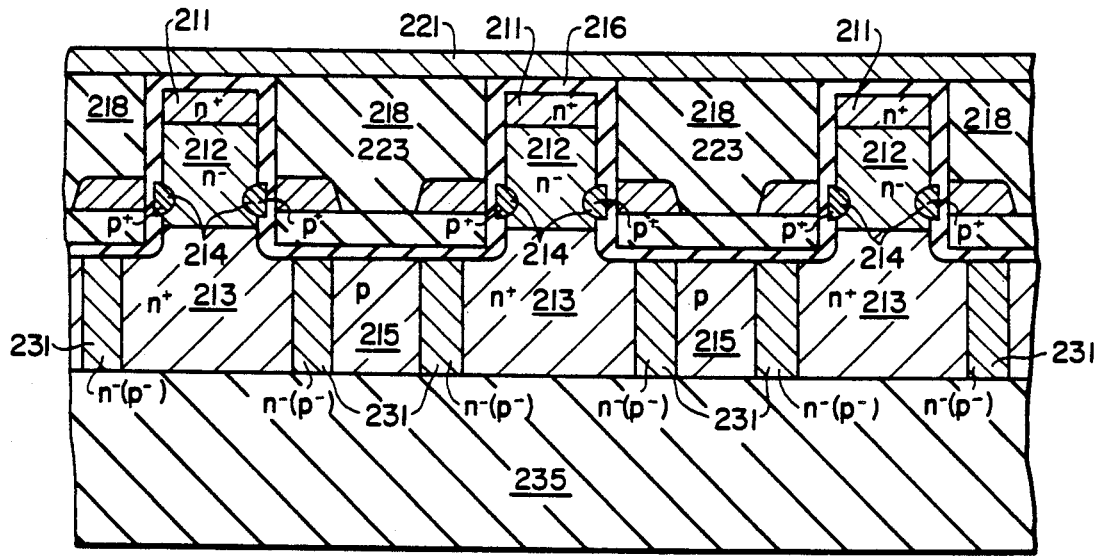
FIGS. 19A and 19B are cross-sectional diagrams of a memory device in two different directions according to another embodiment of the present invention, wherein storage region is disposed near the surface.
Figure 19B:
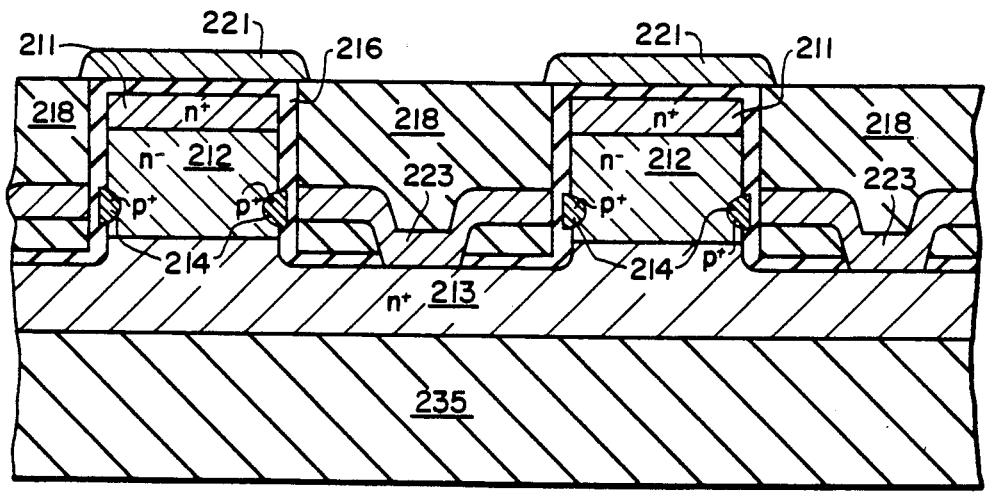

FIGS. 19A and 19B diagrammatically show a dynamic memory cell structure according to another embodiment of the present invention. In this example, the memory cell comprises an insulator substrate 235, an n+ type source region 213 (bit line), an n− (or p−) type region 231 surrounding the source region 213, an isolating p type region 215, a p+ type floating gate region 214 for controlling the current flow between the n+type storage region 211 and the n+ type source region 213, an n− type channel region 212, an insulator region of a recessed portion 218 surrounding the storage regions 211, an insulator layer 216, an electrode region 223 which is connected to the source region 213, and a metal layer 221 which controls the potential of the memory storage region 211 through the insulator layer 216. In this embodiment, the resistance as well as the capacitance in the vicinity of the source region can be reduced, and thus the operational speed of the device can be increased. For reducing the resistance of the bit region 213, an electrode 223 is connected to the source region 213. The insulator substrate 235 is used to reduce the capacitance between the source region 213 and the insulator substrate 235. FIG. 19B is a cross-sectional diagram as viewed along the bitline 213 which is shown in FIG. 19A. The contact of the source region 213 with the electrode region 223 is clearly seen.

Figure 20A:
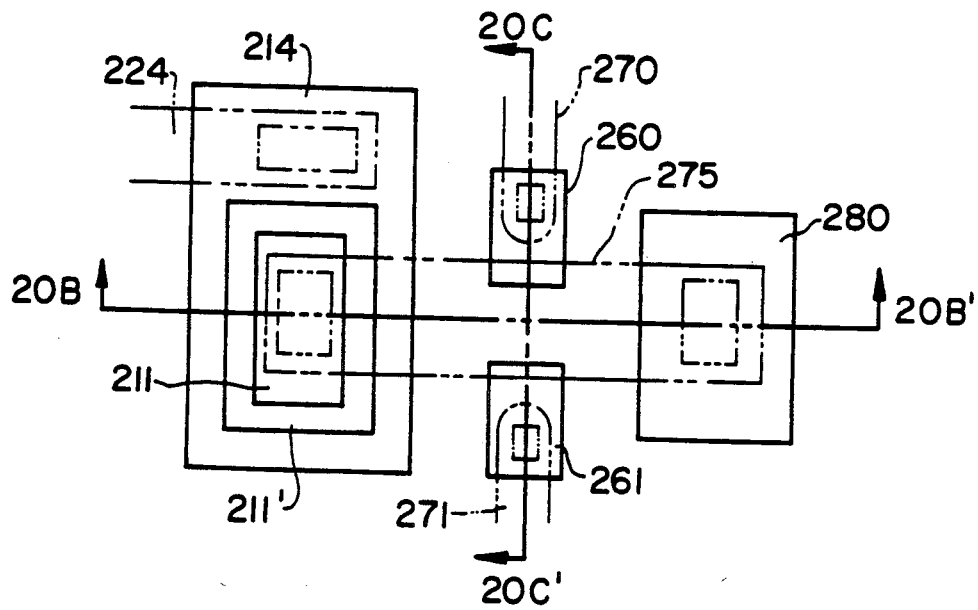
FIGS. 20A to 20C are a top view and two cross-sectional views of a semiconductor memory provided with a sensor element.
Figure 20B:
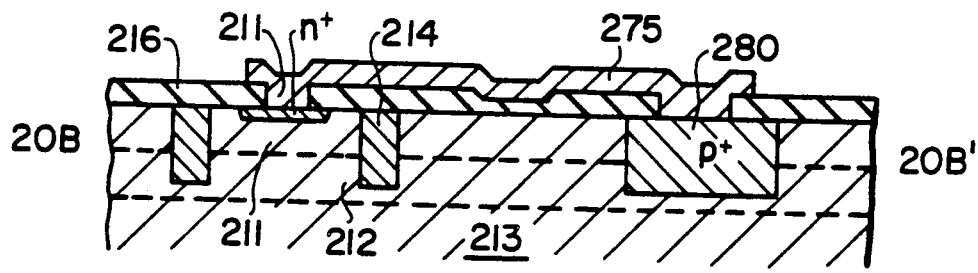
Figure 20C:
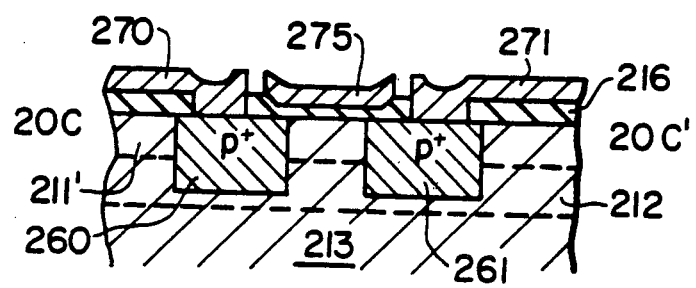

FIGS. 20A, 20B and 20C are diagrammatic representation of a semiconductor memory device according to the present invention. In a memory device, a memory cell is connected with a sensor formed in the same semiconductor body. FIG. 20A is the top view and FIGS. 20B and 20C are cross-sections along the lines 20B—20B' and 20C—20C'. An n+ type memory storage region 211 is formed in a surface portion of a semiconductor body and is contacted with a metal layer 275 which extends to a p+ region 280 which is formed in the same semiconductor body, thereby providing a capacitance sufficient to store electrons therein. Furthermore, a gate region 214 surrounds the n+ type source region 211 and an n type region 211'. A sensor FET comprises p+ type regions 260 and 261 formed in an intermediate point of the metal electrode 275.

In FIG. 20B, as viewed along the line 20B—20B' of FIG. 20A, the metal region 275 connects the n+ type storage region 211 with the p+ type region 280, and current channels are formed between the source region 213 and the storage region 211 through the n type regions 211' and 212. In FIG. 20C as viewed along the line 20C—20C' of FIG. 20A, the sensor element comprising the p+ type regions 260 and 261 is shown, and the metal layer 275 connected to the memory storage region 211 is seen above the insulator layer 216. The potential change of the metal layer 275 due to the change in the memory cell state can be observed by the sensor, which can be composed of a MIS type field effect transistor or a static induction transistor or the like. The metal layer 275 may also be formed with a conducting semiconductor. Also, the metal layer 275 may be formed with a MIS structure. As an example, a memory sensor composed of a MIS type field effect transistor is shown in FIGS. 20A, 20B and 20C. As mentioned previously, other detectors such as one comprised of an SIT may also be applicable.

Optical data writing can be performed by designing the structure so as to inject light rays of sufficient energy to the vicinity of the barrier height.

Figure 21A:
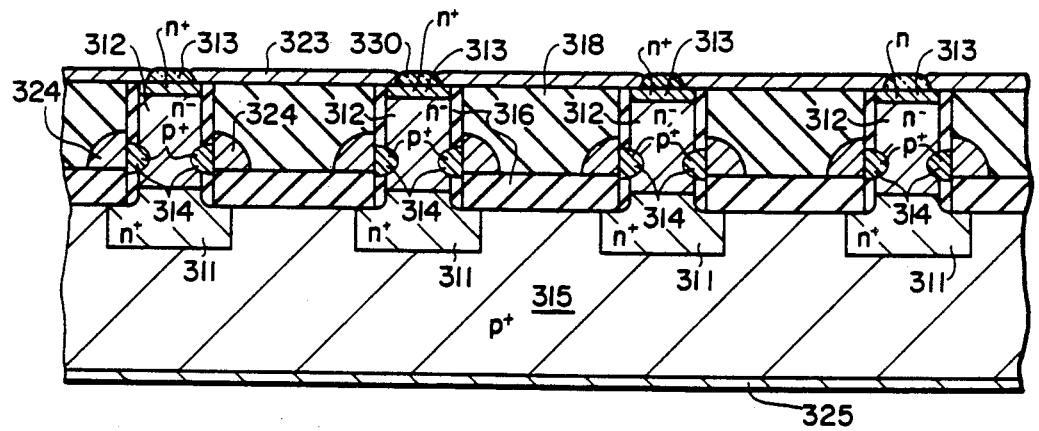
Figure 21B:
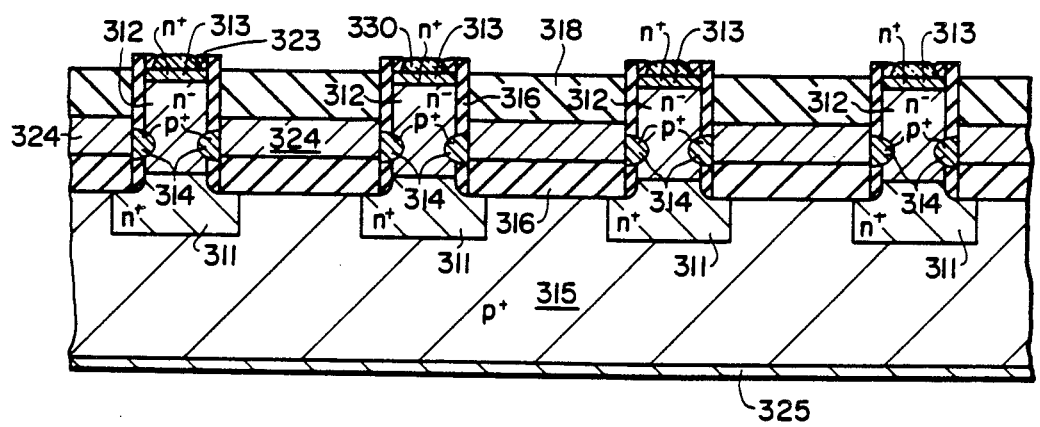

FIGS. 21A and 21B show a semiconductor memory device adapted for optically writing data. The total structure resembles the one shown in FIG. 12 excepting the point that windows are provided on the source regions. Namely, part of the bit line electrode 323 is replaced by a transparent window 330 which may be formed with an insulating material such as silicon oxide, silicon nitride, aluminium oxide, and the like, and a combination thereof, or it may be formed with a transparent electrode such as indium oxide or tin oxide. Furthermore, the n+ type source region 313 is designed thin enough, for example, of the order of 0.3 to 0.5 μm to transmit sufficient light rays into the n− type channel 312. The thickness of the window can be set at such a value as will be able to serve also as an antireflection coating for the exciting light rays. The distance between the gate region 314 and the storage region 311 is designed at a small value so that breakdown does occur at a relatively low voltage, for example of the order of 0.1 to 1 μm. The impurity concentrations of the respective regions can be similar to those of FIG. 12.

Operation of the memory device of FIGS. 21A and 21B will be described below. The word line 324 is reversely (in this embodiment negatively) biased deeply to be just below the avalanche breakdown. In the writing operation, the bit line 323 is held, for example, at zero potential. When light rays of sufficient photon energy are injected into such memory cell, generation of electron-hole pair is caused optically in the region of a high field intensity between the gate region 314 and the storage region 311. The electron-hole pairs thus generated will cause avalanche. Among the generated carriers, holes are attracted to and drawn into the gate region 314, while electrons are attracted to and drawn into the storage region 311. When the light irradiation is stopped, the avalanche is also stopped, and carrier transport is stopped. The storage region 311 is negatively charged up by the electrons having flown into the n+ type storage region. If the stored charge is assumed to be −Q and the capacitance of the storage region which is mainly determined by the capacitance between the storage region and the substrate is assumed to be C, the potential of the storage region will become −Q/C. For reading the stored data, the word line voltage, and hence the gate voltage, may be decreased, for example to the ground potential. The potential barrier generated in the channel will decrease or vanish. Then, the electrons stored in the source region will flow into the source region 313. Data can be read out by sensing the presence or absence of a current. If the device parameters are so selected that the potential barrier in the channel completely vanishes at zero gate bias, carriers stored in the storage region flow out into the source region almost perfectly. In the case wherein a potential barrier remains in the channel even at zero gate bias, the bit line may be applied with a positive voltage. Those bit lines connected to other storage cells than the one which is to be read out may be applied with a negative voltage when the word line voltage is decreased.

The semiconductor memory device according to this embodiment can be successively written by a light beam of a diameter approximately corresponding to a memory cell. Furthermore, since the amount of the charge stored in the storage region varies with the intensity of incident light, the light pattern in a plane can be directly recorded at a time. That is, picture memory can be effected at a time. The spatial accuracy and resolution of the stored image are determined by the dimensions of each memory cell and the distance between the adjacent memory cells. Memory cells with a diameter of 2 to 3 μmω and a (center-to-center) distance of 5 to 10 μm can be manufactured. In the above description, avalanche is caused by seed electron-hole pairs excited by the incident light. When the incident light is sufficiently intense and sufficient electron-hole pairs are generated by optical excitation, however, there is no need to cause avalanche, and carriers sufficient to be detected can be drifted into the storage region. Namely, the word line voltage may be decreased below the voltage which would cause avalanche.

It will be apparent that many embodiments which have been described previously or which will be described hereinafter may be modified to use light rays for writing memory by the provision of transparent windows and by a decrease in the thickness of the heavily doped region disposed in the surface portion. The source region may be dispensed with, and a transparent electrode may be directly contacted to the high resistivity region to form a Schottkey electrode.

Figure 22:
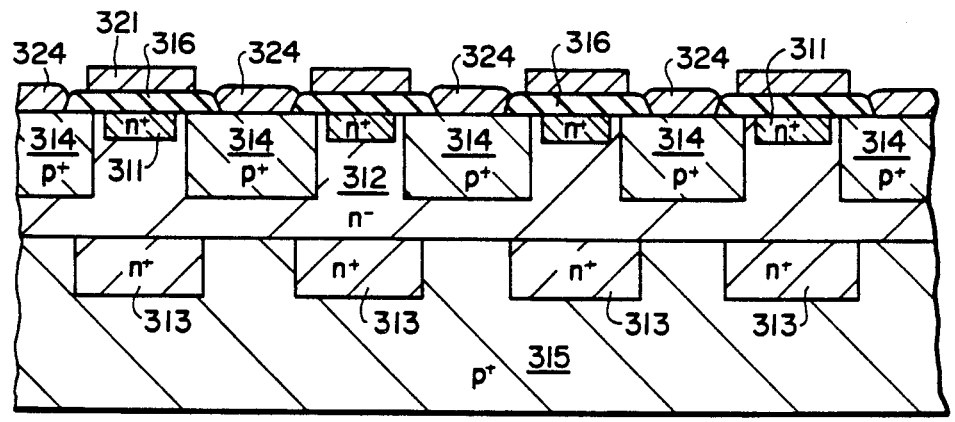
Figure 42:
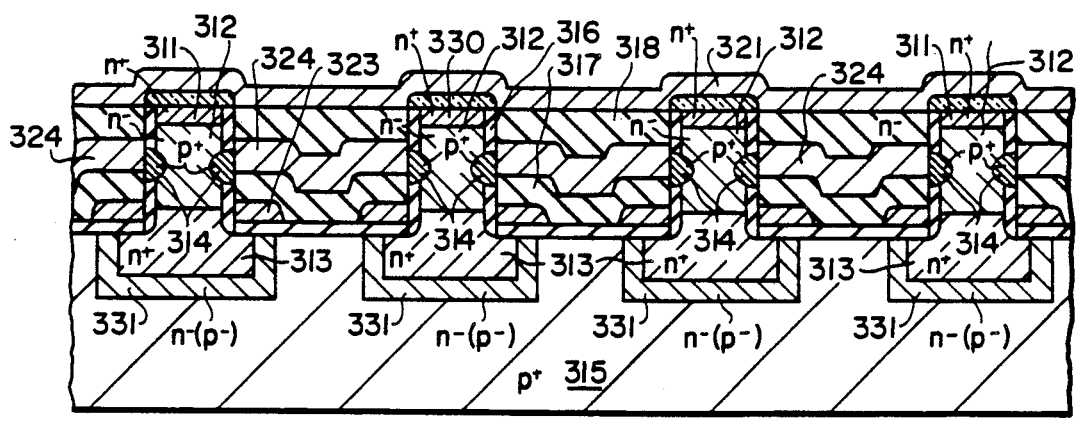

FIGS. 22 and 42 show other structures capable of carrying out optical writing. In FIG. 22, the storage region 311 is positioned in the surface portion, and the insulator layer 316 covers the surface thereof. The gate region 314 is connected to the word line 324.

The source region 313 is embedded in the p+ type substrate and serves as a bit line. The gate (metal) electrode 324 is not necessarily provided when the gate region 314 is of a low resistivity.

The electrode 321 is a transparent electrode, at least in the portion on the memory cell and is held at a given constant voltage (including the ground potential).

FIG. 42 shows a recessed gate type structure. There are also provided metallic source electrode 323 for reducing the resistance of the bit line 313, and a high resistivity region 331 surrounding the bit line to reduce the capacitance of the bit line. The source electrode 323 may be dispensed with if the voltage drop in the bit line does not cause any problem.

Operation of these embodiments will be apparent from the foregoing statement. For example, a reverse bias is applied between the gate and the storage regions through respective electrodes 324 and 321 and a light beam is applied through a window and/or a transparent electrode. Excited electrons travel into the storage region 311 and excited holes flow into the gate region.

Figure 23:
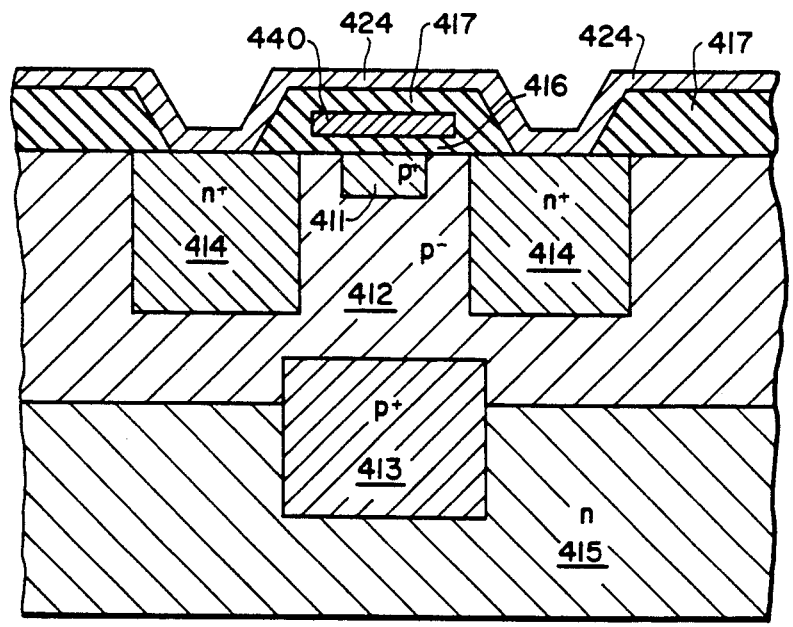
FIGS. 23 and 24 are cross-sectional diagrams of nonvolatile memory devices according to further embodiments of the present invention.
Figure 24:
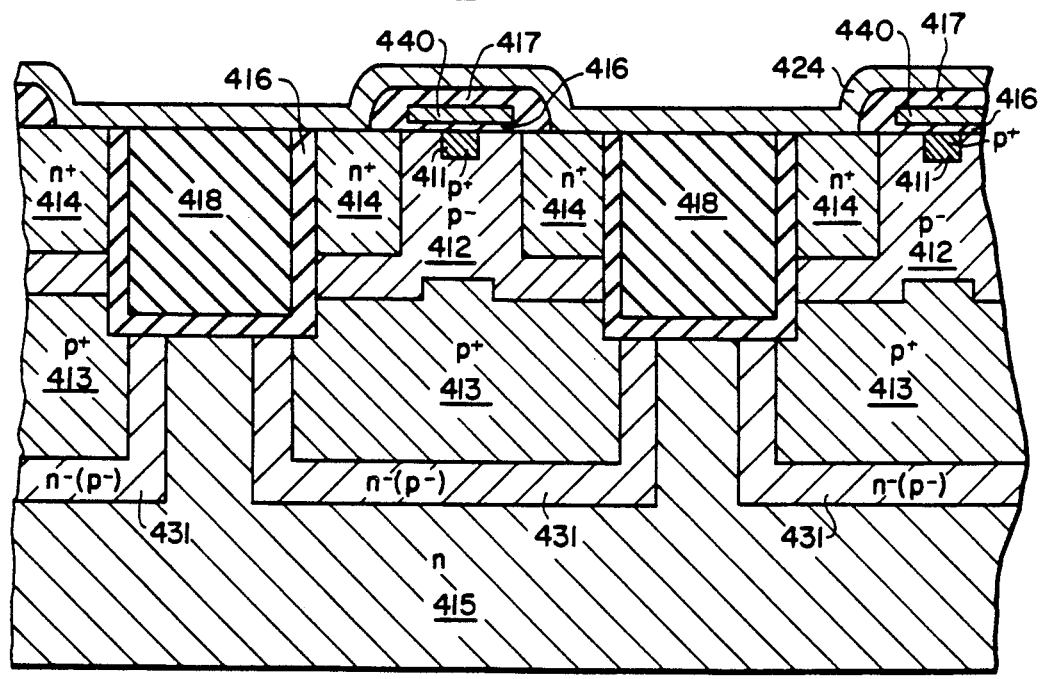

FIGS. 23 and 24 show diagrammatic cross-sections of non-volatile memory cells according to the present invention. In FIG. 23 the memory cell comprises an n type substrate 415, a p+ type source region (bit line) 413, a p− type channel region 412 disposed between the source region 413 and a p+ type storage region 411, an n+ type gate region 414 which is in contact with the word line 424, insulator regions 416 and 417, and a floating gate region 440 surrounded by the insulator regions 416 and 417. Since the operational principles of these devices shown in both FIGS. 23 and 24 are substantially the same, explanation will be made by referring to only FIG. 23. The bit line 413 is embedded in the substrate 415, and the floating gate region 440 is made with a metal such as Al and Mo, or the like, or with a material such as polycrystalline silicon having a low resistivity. The thickness of the insulator layer 416 between the under surface of the floating gate 440 and the p+ type storage region 411 will preferably be selected between about 1000 Angstrom and about 2000 Angstrom. The thickness of the insulator layer, however, is not definitely restricted to the above-mentioned region. The p− type region 412 between the n+ type gate regions 414 is almost completely occupied with the depletion layer produced by the built-in potential of n+p− junction located between the p− type region 412 and the n+ type region 414, thus providing a potential barrier against the current flow between the source region 413 and the storage region 411. Since a high voltage is applied between the digit line 413 and the gate region 414 which is connected with the word line 424, it should be understood that, to store electrons into the floating gate region 440, the state of just-before avalanche is produced. And then, by the avalanche thus produced, electron-hole pairs are induced in the p− type region. Among the generated electrons, some electrons gain a higher potential than a certain threshold enough to penetrate through insulator region 416 up to the floating region 440. Due to the high voltage between the p+ type source 413 and the word line 424 to which is applied a high positive voltage, electrons are effectively injected into the floating gate region 440. If the electromagnetic field between the floating gate and the semiconductor body is made as high as possible the carriers (electrons in this case) generated by the avalanche are effectively injected into the floating gate region 440. When, thereafter, the voltage applied between the source region 413 and the gate region 414 is removed the electrons will be stored and confined in the floating gate region 440 since the floating gate region 440 is surrounded by the insulator layers 16 and 17 which are made with a high resistivity oxide or the like. The surface potential of the p+ region 411 thus will increase in the negative polarity corresponding to the stored electrons in the floating gate 440, and thus the holes are accumulated in the neighbourhood of the surface of the p+ region 411. Even when the applied voltage is removed, the above mentioned state will remain without causing any disturbance to the storage 440. In this way, a non-volatile memory cell can be provided according to the above embodiments. When it is required to read data in a memory cell, a backward voltage, which is a negative voltage in this case, is applied to the n+ type gate region 414, whereupon the potential barrier against holes is decreased, and moreover a negative voltage of an appropriate magnitude may be applied also to the bit line 413 to further lower (in this case) floating gate 440 are desired to be cleared, or in case the stored electrons in the floating gate 440 are desired to be vanished, ultraviolet rays may be irradiated to the floating gate 440 or a high voltage may be applied to the word line 424.

FIG. 24 shows another non-volatile semiconductor memory cells. In this structure, insulator regions 418 and 416 are formed between memory storage cells, and an n− type (or p− type) region 431 is formed around the bottom and the side surface of the p+ type source 413. Therefore, the punch-through current between the adjacent gate regions is almost perfectly prevented in this structure as compared to that of FIG. 23. When this example is compared with the structure of FIG. 23, it will be understood that in this instant case there can be applied a higher voltage between the gate regions 414 and there can be obtained a higher efficiency for writing a memory cell. The digit line (source) region 413 has a projection protruding into the channel region 412. This projection provides a higher efficiency in injecting electrons into the floating gate as well as provides an improvement in the higher operation speed for reading and writing a memory cell. It will be apparent that this projection in the p+ region 413 is not necessarily provided in the device, but may preferably be provided for the purpose of acquiring higher performance of the device. Due to the provision of the storage cell region 411 in FIGS. 23 and 24, the storage efficiency of carriers becomes increased, and the time interval to refresh the memory cells can be increased also.

As has been described above, the storage region may accumulate or deplete charge carriers for memorizing data. When charge carriers are to be depleted from the storage region, the storage region should practically be formed with a heavily doped region since a region short of carriers cannot supply carriers. When the storage region is depleted, there is established a reverse bias between the gate and the storage regions. However, when the storage region accumulates charge carriers, they would establish a forward voltage for the pn junction between the gate region and the storage cell (or the channel). Therefore, the gate region should be reversely biased. Here, however, the storage region may not be a heavily doped region when the band is bended by an external force in the storage region. Embodiments of memory cells without heavily doped storage region will be described herein-below.

Figure 25A:
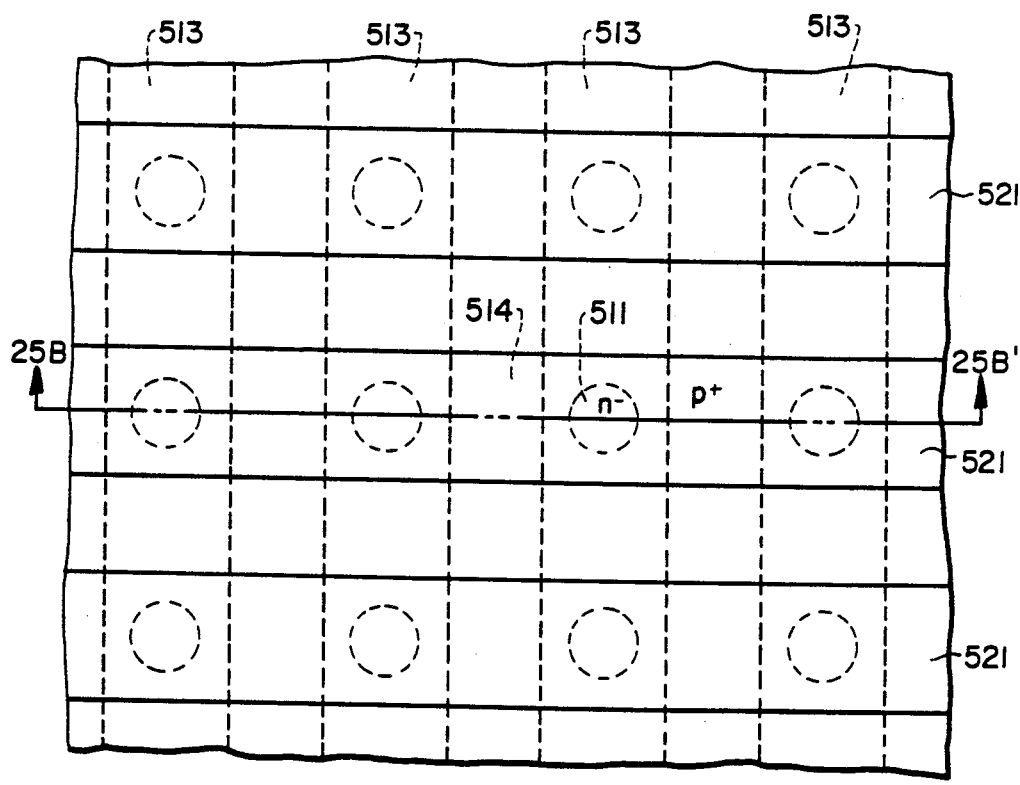
Figure 25B:
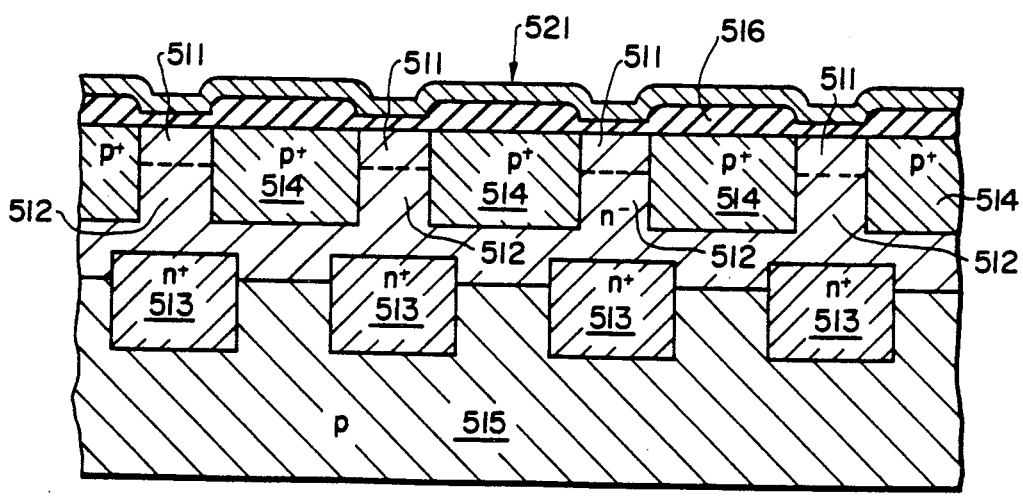

FIGS. 25A and 25B are a diagrammatic top view and a cross-section of an example of the dynamic random access memory cells according to the present invention. The memory cells are formed with a p type substrate 515, an n+ source region (the bit line) 513, an n− type region 512 which provides a channel region 512 between the source region and the n type storage region 511, a p type gate region 514 located adjacent to the storage region 511, an insulator layer 516 formed over the surface, and a metal layer the word line 521 above the insulator layer 516. This structure brings about such advantages that carriers can be drifted with the mobility in the semiconductor bulk and are controlled by the effect of the built-in potential of the semiconductor, and that the surface area occupied by one cell becomes practically small, thus enabling a highly integrated semiconductor device. In FIG. 25, at the cross region of the bit line region 513 and the word line region 521, are indicated circles 511 which represent the storage region of the device. In FIG. 25B, the n− type channel region is almost completely depleted by the diffusion potential of the p+ n− junction between the gate region 514 and the channel region 512. The bit line 513 is buried or embedded in the substrate 515. The behaviour of operation of the devices are made in the following description. When it is necessary to write or store data in the memory, a voltage for writing data, for example about 10 V, is applied to the word line 514. Whereupon, the electrons are injected from the bit line 513 and are stored in the neighbourhood of the surface region (the storage region) 511. During the state of storing the data, the potential of the word line 514 is reduced to about one half of the voltage for writing data, so that the stored electrons do not flow out of the storage region 511. Among the memory cells, there are some cells where data are not required to be stored. For such cells, the voltage applied to the bit line 513 is maintained to almost the same potential as that applied to the word line 514, and thus the electrons are not injected nor stored in such cells. For reading out data from the memory cells, it can be achieved only by decreasing the potential of the word line 514 to the ground potential. Whereupon, the stored electrons flow out of the storage region 511, and, further, due to the built-in potential of the p+ n− junction or the like, the electrons can be flown by the drift as well as by the diffusion, and hence a sufficiently high speed reading operation is realized. Upon writing data into the memory cells, the electrons will flow out of the bit line 513 through the potential barrier region 512 into the storage region 511. Between the potential barrier and the storage region is applied a high electric field, the electrons will flow with a high speed into the storage region 511. This will bring about a very high speed writing operation of the device. As compared with the conventional memory cells the performance of which is mainly determined by the surface transport or conduction, this instant structure has such advantageous properties that carriers are transported through a semiconductor bulk to utilize the bulk mobility, thereby improving the operation speed of writing and reading, and that the packing density can be increased. As to the impurity concentrations of the p+ gate region 514, the n− type channel region 512, and so on, and as to the distance between the bit regions, they are properly selected so as to make the region between the bit regions to be completely depleted, and hence no current is allowed to flow therebetween.

Figure 26:
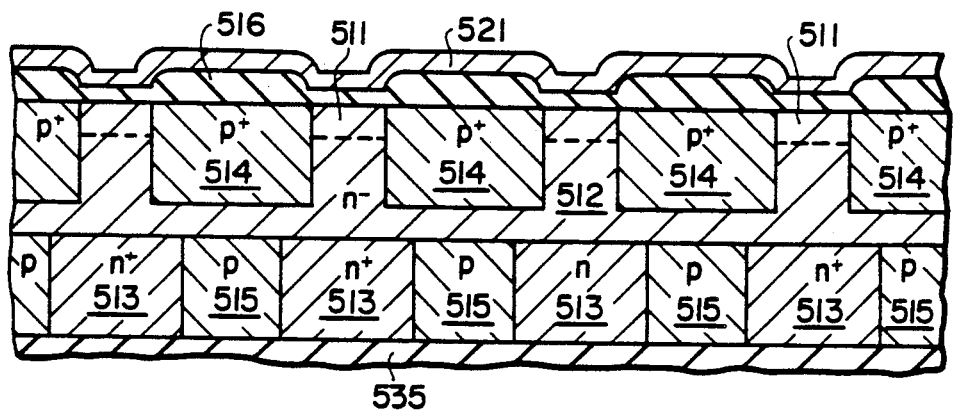

FIG. 26 is a diagrammatic representation of the dynamic memory cells according to another embodiment of the present invention. The device is formed in a structure almost similar to that of FIG. 25B, with the exceptions of the insulator substrate 535 and of the flat surface alignment of the bit region 513 relative to the isolating p type region 515. The insulator substrate reduces the capacitance between the n+ type bit region 513 and the substrate 535, and moreover the p type region 515 separates apart the bit regions efficiently, and therefore a high speed operation of the device is enhanced. The substrate 535 may be formed with such insulator materials as sapphire, spinel and the like. The operational principles of this device are almost the same as those of the device shown in FIG. 25B.

Figure 27:
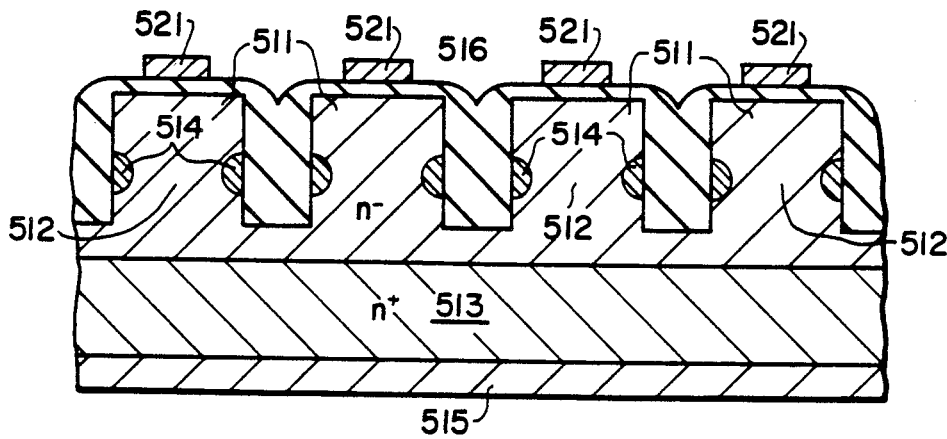

FIG. 27 shows a diagrammatic cross-section of a dynamic semiconductor memory according to another embodiment of the present invention. This device is formed with a p type substrate 515, an n+ type source region 513 and an n− type region 512 on the source region 513 which is made by replying on the epitaxial growth method. The circumference of the channel region 512 is recessed, and the gate region 514 is formed by replying on the acceptor diffusion technique, and the insulator material fills in the recess. Since the memory cell is located amidst the insulator region 516, the leak current as well as the electrostatic capacitance is efficiently reduced. The storage region is formed on the channel region 512, over which a metal electrode 521 is formed through the insulator region 512 to form a MIS structure. The operational principles of this device are nearly similar to those of the device shown in FIG. 26. In this structure, a metal-insulator-semiconductor type structure is used. When a two-dimensional matrix of the memory cells is intended to be formed, the metal region 521 may be used as a word line and the n+ type source region 513 is used as a bit line. In this case, instead of the bit line 513, the gate region may help in the selection of the address of the cell is appropriately arranged with respect to the word line 521. Namely, the gate regions 514 may be connected by the metal region. Such a structure can be formed by the well known technique of the semiconductor manufacture, such as diffusion, etching, ion implantation, vacuum deposition, molecular beam evaporation, or like techniques. The matrix of such memory cell comprises the word lines 521 and the bit lines 514.

Figure 28A:
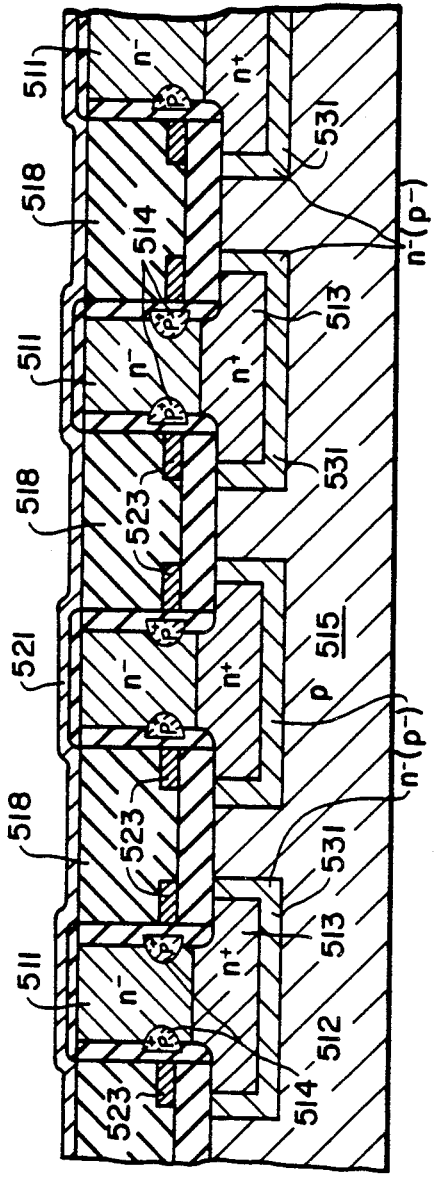
FIGS. 28A and 28B are cross-sectional diagrams of a memory device according to another embodiment.
Figure 28B:
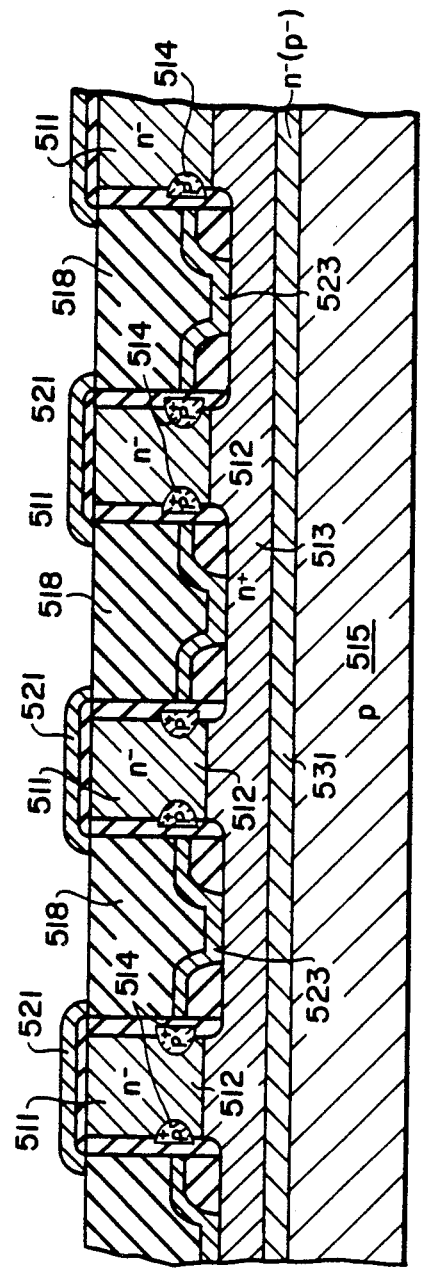

FIGS. 28A and 28B show a diagrammatic cross-sectional representation of a structure used in the memory cells according to another embodiment of the present invention. FIGS. 28A is a view along a word line 521 and FIG. 28B is a view along a bit line 513. The device is formed with a p type substrate 515, n− (p−) type envelope regions 531 around source regions 513 (bit lines), n− type channel regions 512, gate regions 514 for controlling the current flow between the source region 513 and the storage region 511, metal electrodes 523 provided to reduce the resistivity of the bit regions 512, an insulator layer 516 for passivating the surface and separating each cell from the metal electrode of word lines 521. As mentioned previously, the channel region 512 is almost completely depleted by the built-in potential of the $p^{30}$ $n^-$ junction made of the gate regions 514 and the channel region 512. The current flow between the bit line 513 and the storage region 511 is controlled by the potentials imparted to the word line 521, bit line 513 and the gate region 514 as well as by the potential barrier in the channel region 512. The insulator regions 516 are made with silicon oxide ($SiO_2$), silicon nitride ($Si_3N_4$), aluminum oxide ($Al_2O_3$) or the like, or with a combinations thereof. The word line is made with a metal like aluminum (Al), molybdenum (Mo) or the like, or with a low resistivity material like doped polycrystalline silicon or the like. The insulator region 518 is made with the same material as that of the insulator region 516 or polyimide or an insulator resin or the like. The impurity concentrations of the respective semiconductor (silicon) regions are about: $10^{17}$ to $10^{21}$ cm$^{-3}$ for the bit line 513, $10^{11}$ to $10^{16}$ cm$^{-3}$ for the storage region 511, $10^{15}$ to $10^{20}$ cm$^{-3}$ for the substrate 515, $10^{15}$ to $10^{21}$ cm$^{-3}$ for the gate region 514 and $10^{11}$ to $10^{15}$ cm$^{-3}$ for the $n^-$ (or $p^-$) region 531. The gate region 514 may be formed in a floating gate structure. The channel width between the gate region 514 is determined by the impurity concentration of the regions 512 and 514, and by the distance between the bit line 513 and the surface of the n type storage region, or the like. The $n^-$ type region between the gate regions 514 must be almost depleted, therefore if the impurity concentration of the storage region 511 is selected at $1\times10^{13}$ cm$^{-3}$, $1\times10^{14}$ cm$^{-3}$ and $1\times10^{15}$ cm$^{-3}$, respectively, then the distance of the channel region 512 will be at most 20 $\mu$m (micrometers), 6 $\mu$m and 2 $\mu$m, respectively.

FIG. 29 shows a cross-section representation along a word line of the memory cells according to another embodiment of the present invention. The structure of the device as well as the operational principles are almost the same as those of the device shown in FIGS. 28A and 28B. However, in this instant case, an insulator substrate 535 made with an insulator material such as sapphire, spinel or the like, is used, and furthermore an $n^-$ (or $p^-$) type region 531 surrounds the bit region 513 to reduce the capacitance which accompanies the $n^+$ type region 513. Therefore, a high speed operation of the device is obtained. The gate region 514 is shown to be the junction type, as an example, but the metal-insulator-semiconductor type (including the metal-oxide-semiconductor type) and the Schottkey type are also applicable to provide a potential barrier in the channel region.

The access time of a semiconductor memory cell depends almost on the buffer circuits of the input and output logic circuits. The static induction transistor proposed by the present inventor which has a high input impedance and a small gate capacitance (between the gate and the source and between the gate and the drain) can be used as the input or output circuits so as to enhance high speed operation of the memory cell. Bipolar transistors can, of course, be used in the buffer circuits. Furthermore, the sense amplifiers amplify the readout signals, and carries out a large part of the total power dissipation of the semiconductor memory device. Since the number of the sense amplifiers is necessarily identical to that of the bit lines, the number will increase in accordance with an increase in the memory capacitance, and hence the power dissipation will increase also. Therefore, the static induction semiconductor which has the great advantages represented by the large voltage amplification and by the excellent characteristics which do not degrade even in a low current region, is preferably used for the sense amplifier to minimize the power dissipation.

FIG. 30 shows a diagrammatic cross-section of a memory device according to another embodiment of the present invention. In this structure, an insulator substrate 535 formed with sapphire, spinel or other insulator crystal or with a high resistivity silicon, gallium phosphor, etc. is used. The storage region 511 is formed on the upper side, and is electrically isolated from the word line 521 with a p type layer 520. The gate region 514 is formed amidst of an n type channel region 512 so that the potential barrier is provided in the channel region 512 between the storage region 511 and the source region 513 which, in turn, is connected with an electrode region 523. The storage region 511 may be formed in the p type region, but its surface to the n type region must be exposed from the under surface of the p type region 520. The distance between the storage cells are selected to be sufficiently long to enhance the large resistivity therebetween. In such a case, during the state of storing data, a slight voltage applied to the p type region 520 will enable to effectively minimize a carrier loss.

FIG. 31 shows a cross-section of the semiconductor memory cells according to another embodiment of the present invention, in which storage cells are disposed in a lower portions. The device comprises a p type substrate 515, n type storage regions 511, $n^-$ type channel regions 512, $n^+$ type source regions 513 upon which is formed bit lines 523, gate regions 514 and an insulator region 518. As mentioned previously, in the channel region 512 is formed a potential barrier by the built-in potential of the $p^+$ $n^-$ junction of the gate region 514 and the channel region 512. The current between the $n^+$ type source region 513 and the storage region 511 is controlled by the potential barrier in the channel region 512 as well as by the potential imparted to the bit line 523 and the substrate 515. Electrons are injected from the $n^+$ type source region 513 through the channel region 512 into the storage region 511.

Figure 32:
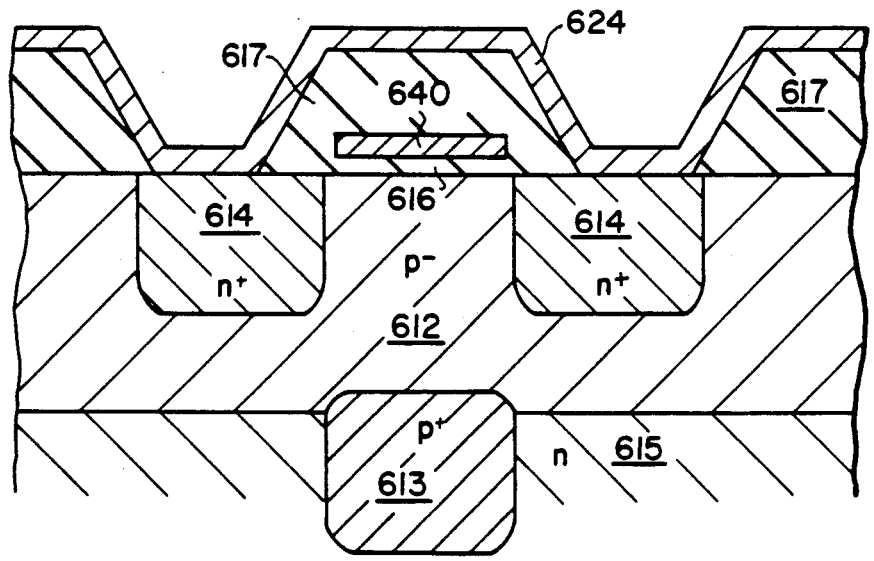
FIGS. 32 to 34 are cross-sectional diagrams of nonvolatile memory devices according to respective embodiments of the present invention.

FIG. 32 shows a diagrammatic cross-section of a nonvolatile memory without the heavily doped storage region according to another embodiment of the present invention. Each memory cell comprises an n type substrate 615, a $p^+$ type source region 613, a $p^-$ type channel and storage region 612, an $n^+$ type gate region 614, a floating gate region 640 embedded in insulator regions 616 and 617, and a metal electrode region 624. The floating gate region 640 may be made with a metal such as aluminum (Al) and molybdenum (Mo) or the like, or with a good conducting material such as polycrystalline silicon or the like. The thickness of the insulator layer 616 located between the lower surface of the floating gate region 640 and the upper surface of the $p^-$ type region 612 may be selected to be about 1000 Angstroms. As the $-$ type channel region 612 is almost completely depleted due to the built-in potential of the $n^+$ $p^-$ junction between the $n^+$ type gate region 614 and the $p^-$ type channel region 612, the potential barrier against the carrier (the hole in this case) is provided in the channel between the $p^+$ type source region 613 and the floating gate region 640. Avalanche may be caused by a high voltage applied between the source region 613 and the gate region 614. Then, some electrons among the electrons generated by the avalanche will gain sufficient energy to pass through the insulator region 616 and will flow in to the floating gate region 640. For obtaining a high effectiveness of injecting carriers (electrons in this case) produced by avalanche into the floating gate region 640, it is required to establish a high electric field between the floating gate region 640 and the semiconductor region 612 located under the insulator 626. If the voltage applied between the source region 613 and the gate region 614 is removed, it should be understood that since the floating gate region 640 is surrounded by an insulator material of a high resistivity oxide layer or the like, the stored electrons will become confined in the floating gate region 640. Corresponding to the negatively charged state of the floating gate region 640, the surface potential of the p⁻ type region 612 will increase in the negative polarity. Therefore, the holes are stored in the surface region of the p⁻ type region 612 corresponding to the stored electrons. This stored state remains even when the power supply to the memory cells is switched off. For reading out the memory cell, a negative voltage is applied to the n+ type region 614 which is connected to the metal layer 624. Whereupon the potential barrier in the channel region 612 is reduced, and a current flow can take place through this channel region 612. If a certain positive voltage is applied to the bit line 613 (the source region), a higher operation speed of reading memory cells will be provided. For clearing the data in the floating gate region 640, ultraviolet rays may be irradiated to the floating gate region 640. Similarly, a high voltage may be applied to the word line 614 to repel the stored charge carriers from the floating gate 640.

Figure 33:
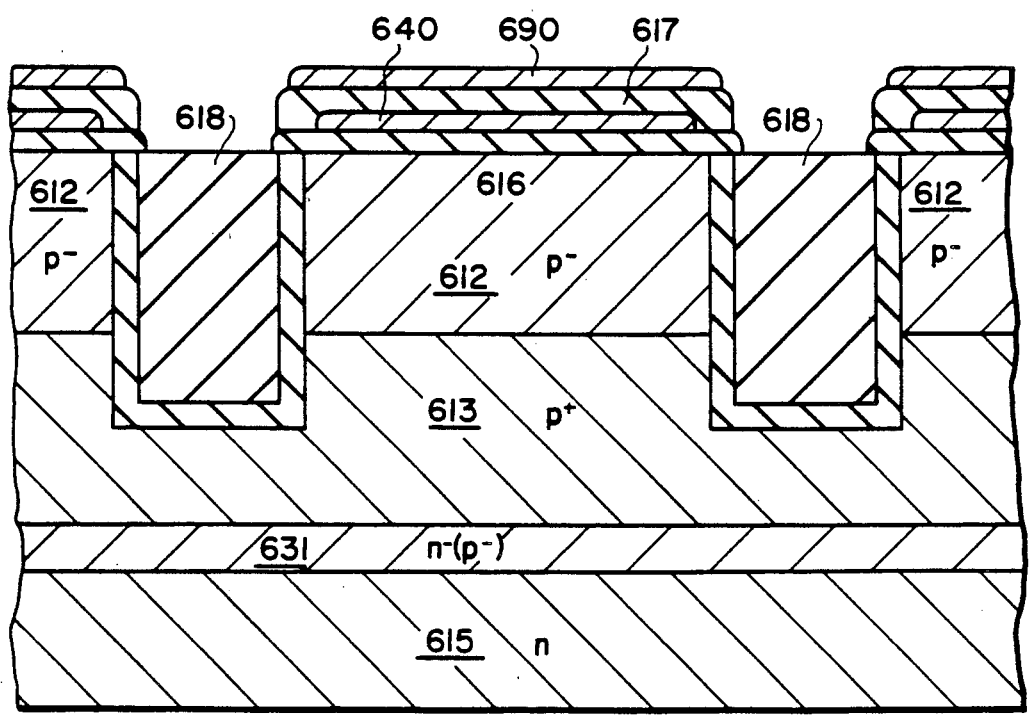
Figure 34:
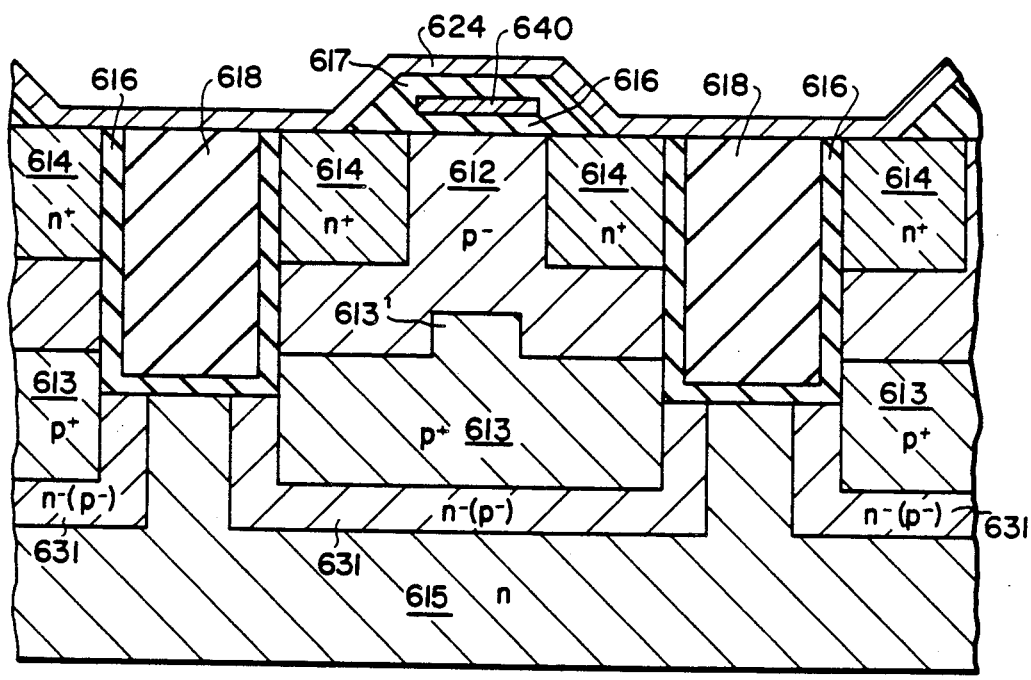

FIG. 33 shows a diagrammatic cross-section of a non-volatile memory device according to another embodiment of the present invention. The memory cell comprises an n type substrate 615, a high resistivity n⁻ (or p⁻) type region 631, a p⁺ type source region 613, a p⁻ type channel and storage region 612, a floating gate region 640 being formed between insulator layers 616 and 617, a metallic layer 690 formed on the insulator layer 617, and an insulator region 618 which fills the recess provided to separate each memory cells apart. The insulator layers 616 and 617 are made, for example, with silicon oxide ($SiO_2$) or the like, and the insulator region 618 is made, for example, with polycrystalline silicon or the like. The impurity concentration of the respective silicon regions are: about $10^{18}$ to $10^{20}$ cm⁻³ for the p⁺ type source region, about $10^{11}$ to $10^{15}$ cm⁻³ for the p⁻ type channel region 612, and about $10^{11}$ to $10^{16}$ cm⁻³ for the high resistivity n⁻ (or p⁻) type region 631. The high resistivity region 631 is provided to reduce the capacitance of the bit line 613 (source region), this enhancing a high speed operation of reading and writing memory cells. This high resistivity region 631 may be made either with an n⁻ type or a p⁻ type semiconductor. If such a high speed operation is not required, this region may be eliminated from the device. In FIG. 33, a p⁻ type channel and a storage region is directly connected to the insulator region 616. However, gate regions may be provided therebetween as shown in the structure of FIG. 34. As the operational principles of the device in FIG. 33 is nearly the same as that of FIG. 34, such explanation will be made in the following description in connection with FIG. 34.

FIG. 34 shows a diagrammatic cross-section of non-volatile memory cells according to another embodiment of the present invention. This structure is an improvement of the structure of FIG. 32 from the aspect that the punch-through current between the gate region 614 and the substrate 615 is sufficiently prevented. In FIG. 34, the non-volatile memory cells are cross-sectionally shown along the word line 624. An n type substrate 615 is used, and each cell is formed with an n⁻ type (or p⁻type) region 631 which surrounds a p⁺ type source region 613, a p⁻ channel and storage region 612, an n⁺ type gate region 614, a floating gate region 640 formed between insulator layers 617 and 616, a metal layer 624 formed on the insulator layer 617 and insulator region 618 and 616 which are provided for separating memory cells. The insulator regions 616 and 617 are made with silicon oxide ($SiO_2$) or the like, whereas the insulator region 618 is made with polycrystalline silicon or the like. The impurity concentration of the respective region are: about $10^{13}$ to $10^{21}$ cm⁻³ for p⁺ type source region 613, about $10^{11}$ to $10^{15}$ cm⁻³ l for the p⁻ type channel and storage region 612, about $10^{17}$ to $10^{21}$ cm⁻³ for the n⁺ type gate region 614 and about $10^{11}$ to $10^{16}$ cm⁻³ for the n⁻ (or p⁻) type high resistivity region 631. The high resistivity region 631 is provided to reduce the capacitance of the bit line 613 (the source region) so that a high operational performance of reading and writing memory cells is provided. Thus, this region may be made either with an n⁻ type or with a p⁻ type semiconductor. If such a high operation is not required, then the high resistivity region 631 may not be formed between the source region 613 and the substrate 615. The projecting portion 613' of the p⁺ type source region 613 is provided to reduce the carrier transit time and to obtain high efficiency of injecting electrons in to the floating gate 640. Thus, the high speed reading and writing operation of the memory cell is improved. If such a high speed operation is not specifically required, this region may be dispensed with.

To store data in the floating gate, a high voltage is applied between the wordline 624 and the bitline 613. In this case a high positive voltage is applied to the word line 624, and avalanche is produced therebetween. Among the electrons generated by avalanche between the gate region 614 and the channel region 612, there will be some electrons that obtain a high energy enough to pass through the insulator regions 616 and to reach the floating gate region 640. Such electrons are stored in the floating gate which is consequently charged up in the negative polarity. Regarding the memory cells in which data are not to be written in, i.e. the memory cells in which electrons should not be injected, the corresponding bit lines connected to such cells are applied with a certain positive voltage, which prevents avalanche. Therefore, the floating gates corresponding to such memory cells are not charged up in the negative polarity. This means that data are not stored in such cells. After the desired floating gate is charged in the negative polarity, if a predetermined forward voltage, for example −0.5 V, is applied to the corresponding word line 624, the potential barrier in the channel region is reduced, and holes will flow into the memory cell corresponding to the negatively charged floating gate and they will be stored in the storage region surrounded by the floating gate 640, the potential barrier and the gate region 614. For reading the memory cell, a forward voltage is applied to the word line 624, and a negative voltage is applied to the bit line simultaneously. The stored electrons in the storage region will flow into the bit line 613, and thus a current is detected.

This memory is of the non-volatile type, however, for the purpose of restoring holes into the storage region. The forward voltage is required to be periodically applied to the word lines 624, at the interval of the cycle time.

The so-called punch-through type bipolar transistor can serve as a substitute for the static induction transistor when the base region is substantially depleted (pinched off), and yet forms a potential barrier for charge carriers in the emitter region.

Therefore, bipolar type structures can also be used in place of the unipolar type structure described hereinabove. Although the bipolar type structure includes regions of two conductivity types in the current path (i.e. emitter and collector regions of one conductivity type and a base region of the other conductivity type), the base region of the punchthrough bipolar type transistor according to the embodiments of the present invention is substantially depleted. Therefore, the conductivity type of the base region will lose most of its meaning excepting that the base region contains ionized impurity atoms of such polarity as well repel out charge carriers from the emitter and the collector regions. Therefore, the punch-through type bipolar transistor according to the embodiments of the present invention may be regarded analogous to the unipolar transistor. When a non-depleted region of the same conductivity type is formed adjacent to a substantially depleted base region, such a non-depleted region will be called "gate region" in this specification.

Figure 35:
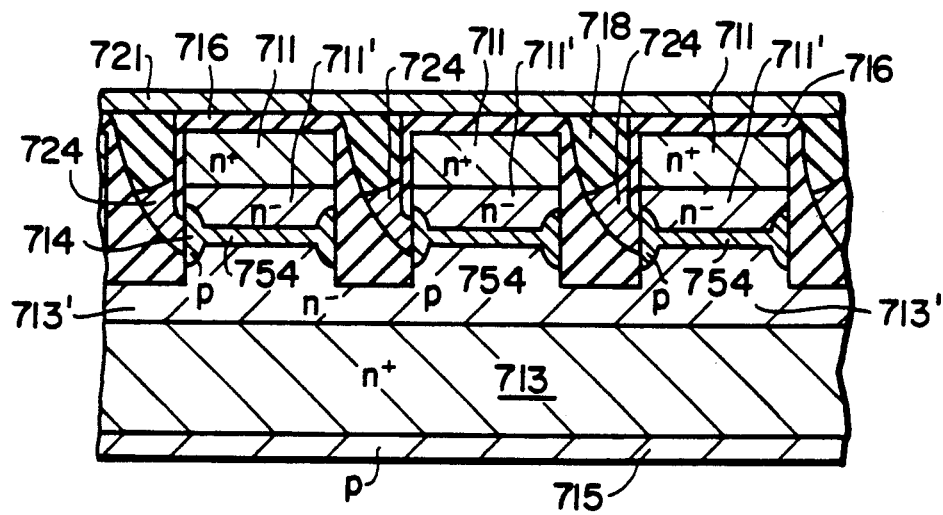

FIG. 35 shows a diagrammatic cross-section of punchthrough bipolar transistor type memory cells according to an embodiment of the present invention. Each memory cell comprises a p type substrate 715, an n+ type source region 713, an n− type region 713' (which may be used as a source region, but this region may be dispensed with in this structure if desired), an n− type region 711' an n+ type storage region 711, a p type base region 754 disposed between the n− type region 711' and 713', a metal layer 721 which is disposed on the n+ type storage region 711 through an insulator region 716, an insulator region 718 disposed between and separating adjacent memory cells, a p type gate region 714 contiguous to the p type base region 754 and a metal region 724 connected with the p type gate region 714.

When the write operation is to be carried out, the potential of the storage cell 711 is decreased through the voltage on the metal electrode 721, and at the same time such forward voltage is applied to the gate electrode 724 so that the potential barrier formed in the channel region is reduced by narrowing or lowering the barrier region in the channel region between the source region 713 and the storage region 711. Therefore, charge carriers are drifted into the storage region and stored in the storage region by a current flow through the channel region. For such storage cells in which carriers (electrons) should not be stored, such a voltage is not applied to the gate electrode 724. When memory cells form a two-dimensional matrix, the memory cells can be controlled by the voltage applied to the so-called column electrode 721 and the so-called row electrode 724.

During the storage state of the memory cells, every electrode may be grounded or the power supply may be switched off.

When the memory cells are to be read out, the potential barrier of the channel region is reduced by the voltage applied to the gate electrode 754, and moreover if necessary the potential of the source regions 713 and 713' may be slightly decreased.

Figure 36A:
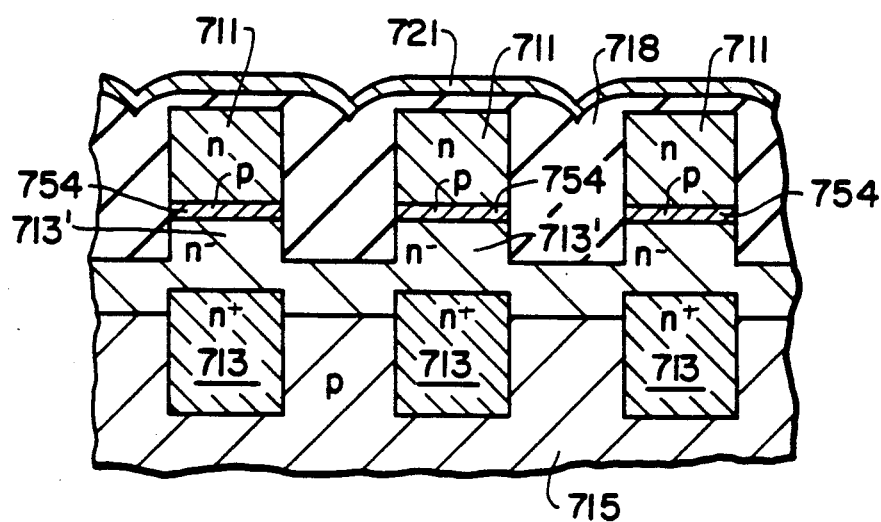

FIG. 36A shows a diagrammatic cross-section of a punch-through bipolar type memory cells according to another embodiment of the present invention. The memory device comprises a p type substrate 715, n+ type source regions 713 embedded in the substrate 715, an n− type region 713', p type base regions 754 between the source region 713 and storage regions 711, insulator regions 718 between the memory cells and metal regions 721 disposed on the storage region 711 through the insulator layer 718. In this case, an electrode for the base region 754 is not provided. The base region 754 is formed with a p type (or intrinsic) high resistivity semiconductor. The storage cell is provided with a metal-insulator-semiconductor structure.

The writing operation into the memory cell is achieved mainly by a positive voltage applied to the so-called column electrode 721, whereas the reading operation is mainly carried out by the positive voltage applied to the so-called row electrode 713 (source region). If additional electrodes are provided in the gate region 754, the operational performance of the memory cell will be more improved.

Figure 36B:
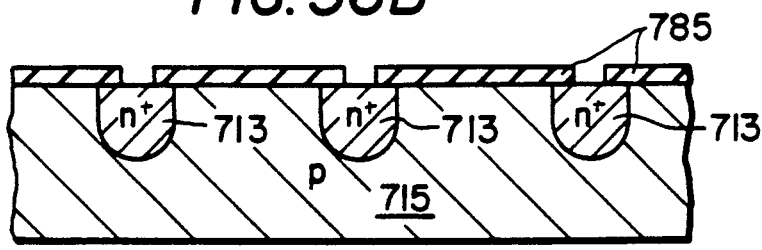
FIGS. 36B and 36D are corss-sectional diagrammatic representations showing how the memory device of FIG. 36A is manufactured.
Figure 36C:
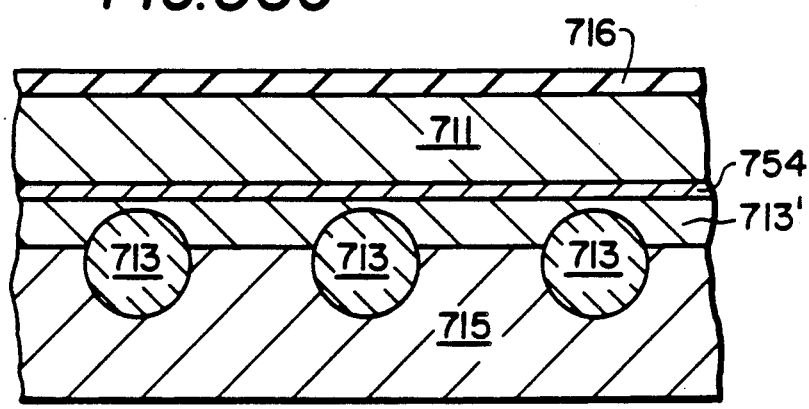
Figure 36D:
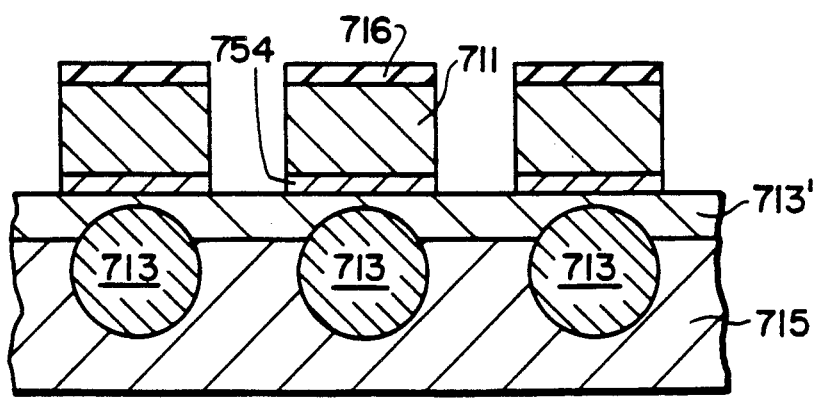

FIGS. 36B, 36C and 36D diagrammatically show the manufacturing steps of the memory cells shown in FIG. 36A.

FIG. 36B shows the step where the n+ type source region 713 is formed by relying on the selective diffusion of an n type impurity material like arsenic (As), stibium or antimony (Sb) and phosphorus (P) or the like using the silicon oxide (SiO$_2$) layer 785 formed on the p type silicon substrate 715 as a mask. The substrate has an impurity concentration around $10^{14}$ to $10^{20}$ cm$^{-3}$. The silicon oxide layer 785 shown in FIG. 36B is removed after the diffusion. In FIG. 36C, using the well-known epitaxial growth method, an n type layer 713' with an impurity concentration around $10^{10}$ to $10^{17}$ cm$^{-3}$, a p type layer 754 with an impurity concentration around $10^{10}$ to $10^{17}$ cm$^{-3}$ and an n type layer 711 with an impurity concentration around $10^{10}$ to $10^{17}$ cm$^{-3}$ are formed, and then the silicon oxide (SiO$_2$) layer 716 is formed by oxidation. In the oxide layer 716, a mask pattern (or windows) are formed by relying on the photolithography technique, and the recessed portion is formed through the p type layer 754 (in some cases the p type layer 754 may remain) by relying on the directional etching technique such as the plasma-etching, the chemical etching and the sputter etching or the like. Then, an insulating material may be formed or deposited and a surface electrode may be deposited thereon. Such gate electrodes as shown in FIG. 35 may be formed by a directional deposition of an insulator material, selective etching of the insulator, and evaporation or deposition of metal or polycrystalline silicon.

Figure 37:
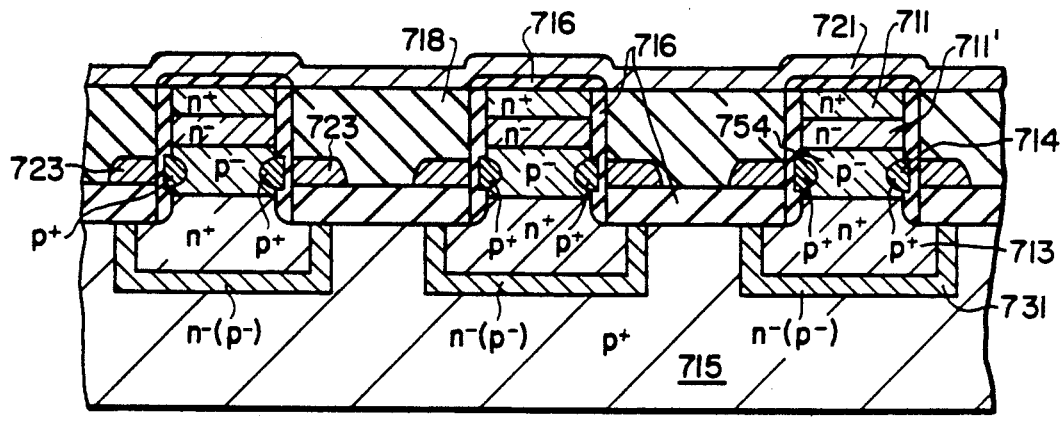

FIG. 37 diagrammatically shows a cross-section of a punch-through bipolar type memory cells according to another embodiment of the present invention, in which each bit line is separated from others and surrounded by a high resistivity region. The device comprises a p type substrate 715, n− (or p−) type regions 731 between n+ type source regions 713 and the substrate 715, p+ type gate regions 714, p− type base regions 754, metal layers 723, n− type channel regions 711', n+ type storage region 711, insulator regions 716 and 718 formed around and between the respective memory cells, and metal regions 721 formed on the storage region 711 through the insulator layer 716. The source region (bit line) 713 is connected with the metal region 723 outside the cell so that the potential of the source region 713 can be controlled by the voltage applied to the metal region 723. The structure formed by the n+ type source region 713, the p− type channel region 754, and n− type channel region 711' may be called a bipolar transistor type, but the p− type channel region 754 and the n− type channel region are almost completely pinched off by the built-in potential. The dimensions of such regions as well as the impurity concentrations are appropriately selected to form appropriate potential barrier by the built-in potential. The metal region 721 (the word line) is formed on the storage region 711 through the insulator region 716. The insulator region 718 in the recessed portion is provided to separate the memory cells. The n⁻ (or p−) type high resistivity region 731 located between the source region 713 and the substrate 715 is provided to reduce the bit line capacitance and to enhance high speed operation of the device.

Figure 38:
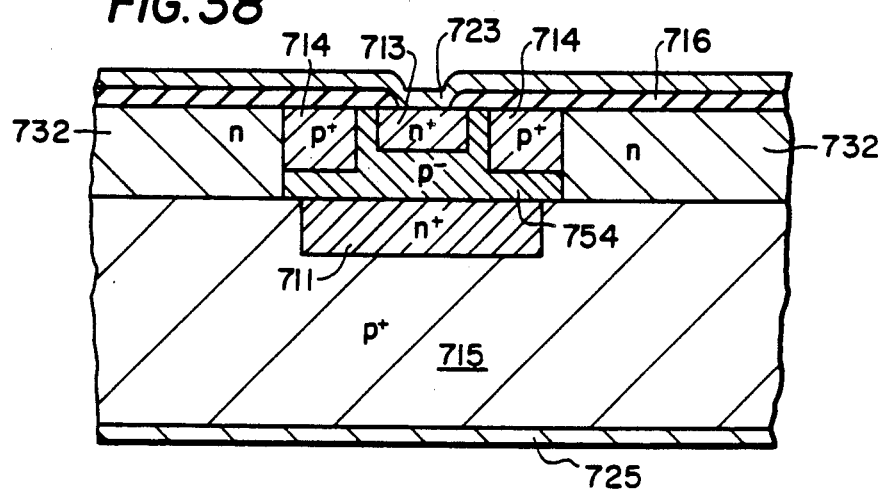

FIG. 38 shows a cross-sectional diagram of a punch-through bipolar type memory cell according to another embodiment of the present invention, in which the storage region is formed in a lower portion of the memory cell. The memory cell is comprised of a metal layer 725, a p+ type substrate 715, an n+ type storage region 711, a p− type channel region 754, an n+ source region 713, a metal region 723 which is connected with the n+ type region 713, a p+ type gate region 714, and an n type region 732. The structure formed with the n+ type source region 713, the p− type channel region 754 and the n+ type storage region 711 may be called the bipolar transistor type. The p− type region 754 may be called the base region but is almost pinched off by the depletion layer formed by the built-in potential. The current flow between the storage region 711 and the source region 713 through the channel region 754, and this current is controlled mainly by the potential barrier formed by the gate region 714 and the voltage applied to the metal region 723.

Figure 39:
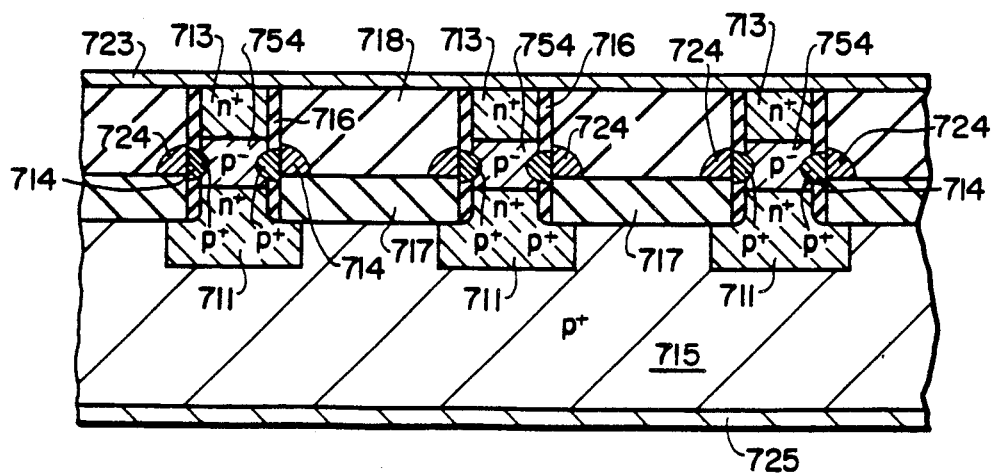

FIG. 39 diagrammatically shows a cross-section of the memory cells according to another embodiment of the present invention in which recessed portion is provided around the cell. The memory cell is comprised of a metal layer 725, a p+ type substrate 715, an n+ type storage region 711, a p− type channel region 754, a p+ type gate region 714, an n+ type source region 713, insulator regions 716, 717 and 718 formed between the memory cells, and a metal layer 723 which is connected with the source region 713. The operational principles of the memory cell in FIG. 39 are similar to those of FIG. 38. However, the punch-through current between memory cells through the gate region 714 which is connected with the metal region 724, or between the gate region 724 and the substrate 715 are effectively prevented. Furthermore, the leak current from the source region 713 is also prevented. Therefore, a desired voltage can be applied without causing such leak current and punch-through current. This feature is especially effective to provide a wide operational range when this memory cell is applied in the field of the analogue memory.

In the above punch-through bipolar type memory cells, the storage region is formed with a heavily doped region. The storage region may not be a heavily doped region but may be formed with an inversion layer as can be seen in the charge coupled devices.

Figure 40:
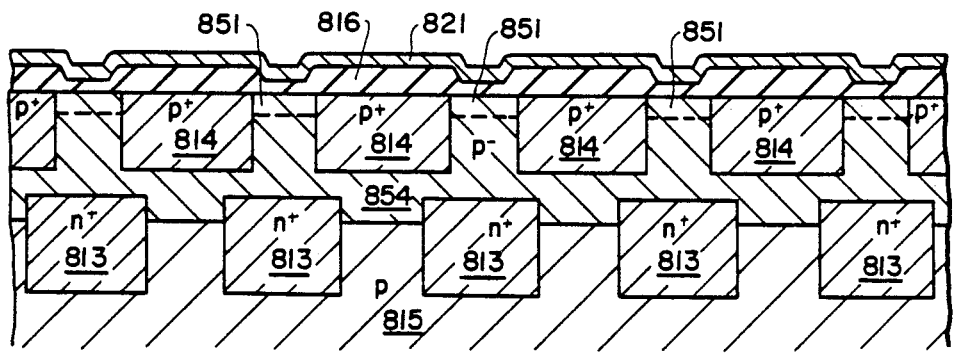
FIGS. 40 and 41 are cross-sectional diagrams of memory devices according to respective embodiments of the present invention.

FIG. 40 shows a diagram of a cross-section of the memory cells according to another embodiment of the present invention. The memory cell comprises a p type substrate 815, an n+ type source region 813 formed in the p type substrate, a p− type channel region 854, a p− type storage region 851, a p+ type gate region 814, an insulator region 816 formed on the semiconductor surface, and a metal layer 821 which is coupled to the storage region 851 through the storage region 851.

The p− type channel region 854 is almost completely depleted by the built-in potential due to the n+ p− junction between the p− type region 854 and the n+ type region 813. The impurity concentration of the p− type region 854 is about $10^{12}$ to $10^{16}$ cm$^{-3}$.

When it is desired to write data into the memory cell, a voltage, for an example of 10 V, is applied to the metal layer 821 (the word line). Whereupon, electrons are injected from the source region 813 (the bit line), and stored in the storage region 851.

In the storage state of the device, the potential of the word line is maintained to one half of the writing potential, whereby the electrons are confined in the storage 851.

In the memory cells in which data are not desired to be written in (the memory cells where electrons are not desired to be injected), the potential of the bit line 831 corresponding to those memory cells is increased and maintained to nearly the same potential as that of the word line 821, thus preventing electrons from injecting into the memory cell.

For reading out the data out of the memory cell, into potential of the word line 821 is reduced and maintained at the ground potential. Whereupon, the electrons stored in the storage region 851 will flow into the bit line 813. The electrons are controlled to flow by diffusion and also by drift due to the effect of the built-in potential of the p+ n− junction, and therefore, a high electron speed is obtained and a high speed operation of reading and writing the memory cell can be provided. Especially, the drift electric field between the surface of the semiconductor and the source region 813 will effectively increase the operation speed of the memory cell.

Figure 41:
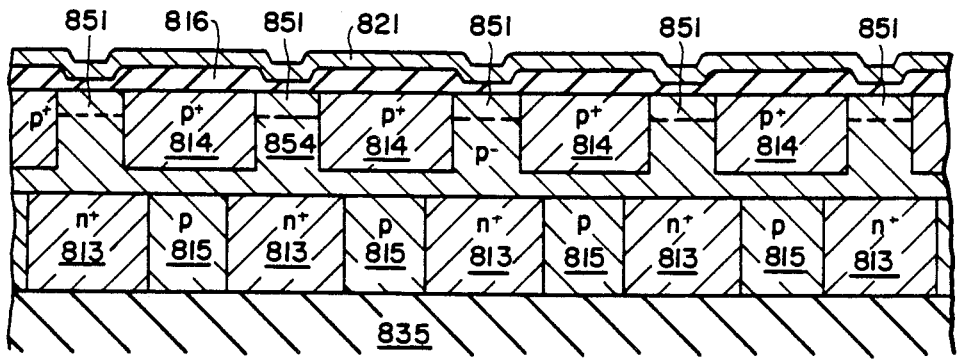

FIG. 41 shows a cross-sectional diagram of memory cells according to another embodiment of the present invention, This structure is similar to that shown in FIG. 40. However, the substrate 835 is formed with an insulating or a high resistivity material. The insulator material may be sapphire, spinel or the like. The operational principles are also similar to those of the device shown in FIG. 40. However, the insulating substrate 835 enhances high speed performance of the device. As mentioned previously, when compared with the conventional semiconductor memory cells which mainly utilize the surface conduction of charge carriers, the memory cells shown in FIGS. 40 and 41 utilize mainly the bulk conduction dominated by the bulk mobility. Therefore, a high operation speed can be realized. If the distance between the metal electrode 821 and the bit line 813 is selected to be about 4 to 5 μm (micrometers), the transit time of electrons which is necessary for electrons to flow through the channel region can be reduced up to 0.1 nano-seconds. Furthermore, in the structure shown in FIGS. 40 and 41, as well as in other Figures, the capacitance of each memory cell can be highly improved. For example, let us assume that the diameter of the storage region 851 is 5 μm nd that the center-to-center distance between such storage regions is 10 μm. Then, a memory array having a density of 1,000,000 bits/cm² can be realized, when only memory cells are considered.

As has been described on various embodiments, according to the present invention, a memory cell comprises a source and a storage region one of which is floating, and a channel region connecting the source and the storage regions and including a potential barrier, the height of this potential barrier being controllable at least by the voltage of the source region relative to that of the storage region. It is obvious that the potential barrier is controlled by the gate voltage. The pn junction type gate structure is obviously replaced by Schottkey barrier or MIS structure including MOS structure. The semiconductor material may be any one of silicon, germanium, III-V compounds, II-VI compounds and other semiconductors. Wide gap semiconductors are adapted for providing high potential barriers. Also, the insulating material is not limited to those described. Any insulating material having appropriate insulating properties can be adopted. Furthermore, it can be seen that the structures shown in the Figures are rather diagrammatic representations to help understanding of the inventive concepts, but they not depict the accurate ones. For example, an embedded n+ region in a p+ type substrate does not precisely keep its shape but deforms to some extent by outdiffusion or redistribution of doped impurities. Also, the recessed portion filled with an insulator may be of any shape as well as the disclosed square shape. Furthermore, the impurity concentrations in the respective semiconductor region are recited only in some of the embodiments. But, it will be apparent for those skilled in the art that, in other embodiments, the impurity concentrations and the dimensions of the respective regions can be easily determined according to the aimed purpose when considered in conjunction with the disclosure for other embodiments.

The recessed gate structure, the metallic electrode extending along the bit line and the high resistivity region surrounding the bit line are provided for enhancing the high speed operation. Therefore, they may be dispensed with in case the intended operation does not require such high speed.

What is claimed is:

1. A semiconductor memory cell array comprising a semiconductor body, a plurality of bit lines and a plurality of word lines crossing said bit lines to form a matrix and at least one semiconductor memory cell disposed at one of the cross points of said bit lines and word lines, said semiconductor memory cell comprising a source semiconductor region of a low resistivity and a first conductivity type, a storage semiconductor region of said first conductivity type and being disposed separate and apart from said source region and constituting one electrode of a capacitor for storing a charge, means for forming the other electrode of said capacitor, a channel semiconductor region formed with a high resistivity semiconductor region of a second conductivity type opposite to said first conductivity type, disposed between said source and said storage regions, being depleted without any bias voltage applied thereto, and establishing a potential barrier which is controllable by at least the voltage of said source region with respect to said storage region, said memory cell further comprising gate means disposed in the neighborhood of said channel region, and said source region is electrically connected to one of said bit lines and said gate means is electrically connected to one of said word lines, said source region constituting said one bit line, said gate means constituting one said word line, means for driving said memory cell, comprising:
means for establishing a reference potential against which voltages are referenced,
means for applying a write-in voltage to said source region; and
means for applying write-in and read-out address gate voltages to said gate region at the time of write-in and read-out operations, said gate region being provided with means for rendering the potential difference of said gate region with respect to said reference potential the same as the potential difference of said source region with respect to said reference potential in the state of the memory cell that its memory content is stored, and for applying, only at the time of write-in and read-out operations, write-in and readout address gate voltages with respect to said other electrode means having an electric polarity relative to said reference potential the same as that of the write-in voltage applied between said source region and said other electrode means.

2. A semiconductor memory cell array according to claim 1, wherein said storage region is disposed in the neighborhood of the surface of said semiconductor body, said source region is electrically connected to one of said bit lines, and said semiconductor memory cell further comprises an insulating layer formed on the surface of said semiconductor body at least on said storage region and a conducting electrode formed on said insulating layer above said storage region and electrically connected ton one of said word lines.

3. A semiconductor memory cell array according to claim 2, wherein said source region constitutes said one bit line.

4. A semiconductor memory cell comprising:
a semiconductor substrate having a first conductivity type;
a first semiconductor region of a second conductivity type opposite to said first conductivity type and a low resistivity, at least partially buried in said semiconductor substrate and elongated along a surface of said substrate;
an epitaxial layer of said first conductivity type and a high resistivity formed on said substrate and said first region;
means for defining a storage region in a surface portion of said epitaxial layer above said first semiconductor region;
an insulating layer formed on the upper surface of said epitaxial layer;
a conductive layer formed on said insulating layr and above said storage region, said storage region, said insulating layer and said conductive layer forming a capacitor,
said epitaxial layer including a second semiconductor gate region of said first conductivity type disposed between said storage region and said first semiconductor region, said second semiconductor gate region having such impurity doping characteristic and a thickness that render the second semiconductor region to be substantially depleted without any bias voltage applied thereto to form a potential barrier to be controllable at least by the voltage between said first semiconductor region and said storage region,
said defining means including a third semiconductor region of said first conductivity type and a low resistivity formed in said epitaxial layer adjacent to the upper surface and substantially surrounding said storage region;

means for driving said memory cell comprising:

means for providing a reference potential against which voltages are produced, means for applying a write-in voltage to said source region; and means for applying write-in and read-out address gate voltages to said gate region at the time of write-in and read-out operations, said gate region being provided with means for rendering the potential difference of said gate region with respect to said reference potential the same as the potential difference of said source region with respect to said reference potential in the state of the memory device that its memory content is stored, and for applying, only at the time of write-out and read-out operations, write-in and read-out address gate voltages with respect to a reference having a same electric polarity relative to said reference potential as that of the write-in voltage applied between said source region and said reference.

5. A semiconductor memory cell according to claim 4, wherein said semiconductor is silicon and said insulating layer is formed of silicon dioxide and said conductive layer is formed of polycrystalline silicon.

6. A semiconductor memory cell according to claim 4, wherein said defining means includes at least one recess formed in said epitaxial layer.

7. A semiconductor memory cell according to claim 4, further comprising a fifth semiconductor region of said first conductivity type and of a low resistivity formed adjacent to said second semiconductor region.

8. A semiconductor memory cell according to claim 6, wherein said epitaxial layer has at least one recess adjacent to said second semiconductor region and said fifth semiconductor region is formed adjacent to said recess.

9. A semiconductor memory cell according to claim 8, further comprising an insulating region filling said recess.

10. A semiconductor memory cell according to claim 4, 5, 6, 7, 8, or 9 further comprising:

a sixth semiconductor region of said first conductivity type, having an impurity concentration lower than those of said substrate and said first semiconductor region, elongated and disposed adjacent to said first semiconductor region.

11. A semiconductor memory device in a semiconductor body and including at least one memory cell which comprises:

a source region including a low resistivity semiconductor region of a first conductivity type for supplying and retrieving charge carriers;

a storage region formed with a semiconductor region and disposed separate from said source region and constituting one electrode of a capacitor for storing signal charge;

means for forming the other electrode of said capacitor;

a channel region formed with a high resistivity semiconductor region of a second conductivity type different from said first conductivity type, disposed between said source region and said storage region and capable of forming a current path for charge carriers therebetween and establishing a potential barrier for charge carriers, said high resistivity semiconductor channel region having such impurity doping characteristics and dimensions that render said high resistivity channel region located between said source and said storage regions to be substantially depleted to provide a potential barrier for charge carriers without any bias applied to the memory cell and that render the height of said potential barrier to be controllable by at least the voltage applied between said source region and said other electrode means, gate means disposed in the neighborhood of said channel region and substantially surrounding and defining said channel regions and forming a pn junction therewith for controlling the potential distribution in said channel region, means for driving said memory device, comprising:

means for providing a reference potential against which voltages are produced, means for applying a write-in voltage to said source region; nd means for applying write-in and read-out address gate voltages to said gate region at the time of write-in and read-out operations, said gate region being provided with means for grounding said gate region relative to said reference potential in the state of the memory device that its memory content is stored, and for applying, only at the time of write-in and read-out operations, write-in and read-out address gate voltages having a same electric polarity relative to said reference potential as that of the write-in voltage applied to said source region.

12. A semiconductor memory device formed in a semiconductor body and including at least one memory cell which comprises:

a storage region formed with a semiconductor region of a first conductivity type and constituting one electrode of a capacitor for storing signal charge;

means for forming the other electrode of said capacitor;

a source region formed with a low resistivity semiconductor region of said first conductivity type for supplying and retrieving charge carriers;

a channel region formed with a high resistivity semiconductor region of said first conductivity type disposed between said source region and said storage region and adapted for forming a controllable current path for charge carriers therebetween, said source, channel and storage region and being disposed in said semiconductor body;

gate means disposed in the neighborhood of said channel region and substantially surrounding and defining said channel region for controlling the potential distribution in said channel, said source region being disposed adjacent to said channel region and including a low resistivity region separated from the outer periphery of said gate means and said channel region having such impurity doping characteristics and dimensions that the potential distribution therein can form a potential barrier for said charge carriers which approaches pinch-off by the influence of said gate means and that the height of said potential barrier is controllable by the voltage applied to said source region with respect to said other electrode means; and means for driving said memory device, comprising:

means for producing a reference potential against which voltages are produced, means for applying a write-in voltage to said source region; and means for applying write-in and read-out address gate voltages to said gate region at the time of write-in and read-out operations, said gate region being provided with means for grounding said gate region relative to said reference potential in the state of the memory cell that its memory content is stored, and for applying only at the time of write-in and read-out operations, write-in and read-out address gate voltages having a same electric polarity relative to said reference potential as that of the write-in voltage applied to said source region.

* * * * *